United States Patent
Jiang et al.

(10) Patent No.: US 9,906,010 B2
(45) Date of Patent: Feb. 27, 2018

(54) DRIVING DEVICE AND DRIVING METHOD

(71) Applicant: Delta Electronics (Shanghai) Co., Ltd., Shanghai (CN)

(72) Inventors: Tao Jiang, Shanghai (CN); Li-Feng Qiao, Shanghai (CN); Jian-Gang Huang, Shanghai (CN); Yang-Yang Tao, Shanghai (CN); Hong-Jian Gan, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 230 days.

(21) Appl. No.: 14/723,474

(22) Filed: May 28, 2015

(65) Prior Publication Data

US 2015/0380922 A1 Dec. 31, 2015

(30) Foreign Application Priority Data

Jun. 25, 2014 (CN) .......................... 2014 1 0292828

(51) Int. Cl.

| | |
|---|---|
| *H02H 3/05* | (2006.01) |
| *H02M 1/088* | (2006.01) |
| *H03K 17/082* | (2006.01) |
| *H03K 17/10* | (2006.01) |
| *H03K 17/691* | (2006.01) |
| *H03K 3/021* | (2006.01) |
| *H02M 1/32* | (2007.01) |

(52) U.S. Cl.
CPC .............. *H02H 3/05* (2013.01); *H02M 1/088* (2013.01); *H02M 1/32* (2013.01); *H03K 3/021* (2013.01); *H03K 17/0822* (2013.01); *H03K 17/102* (2013.01); *H03K 17/691* (2013.01)

(58) Field of Classification Search
CPC ....................................................... H02H 3/05
See application file for complete search history.

(56) References Cited

U.S. PATENT DOCUMENTS

| 4,694,206 A * | 9/1987 | Weinberg ......... H03K 17/04123 |
| | | 327/404 |
| 5,051,609 A | 9/1991 | Smith |
| 6,275,093 B1 | 8/2001 | Shekhawat et al. |
| 2007/0218595 A1 | 9/2007 | Yoshimura |
| 2007/0218598 A1 | 9/2007 | Niimi et al. |
| 2009/0322380 A1 | 12/2009 | Yanagishima et al. |
| 2014/0002168 A1 | 1/2014 | Yanagishima et al. |

(Continued)

FOREIGN PATENT DOCUMENTS

| CN | 102427353 A | 4/2012 |
| CN | 101483334 B | 6/2012 |

(Continued)

*Primary Examiner* — Scott Bauer
(74) *Attorney, Agent, or Firm* — CKC & Partners Co., Ltd.

(57) ABSTRACT

A driving device is configured to drive a power semiconductor switch module based on a main control signal. The driving device includes a voltage-modulating unit and a driving module. When the voltage-modulating unit receives a protection signal, the voltage-modulating unit generates a turn-off pulse signal based on the protection signal. Moreover, the driving module is configured to turn off the power semiconductor switch module based on the turn-off pulse signal. Also disclosed herein is a driving method.

48 Claims, 19 Drawing Sheets

(56) References Cited

U.S. PATENT DOCUMENTS

2014/0049295 A1    2/2014  Gan et al.
2014/0268925 A1*   9/2014  Lee .................. H02M 3/33507
                                                363/21.18

FOREIGN PATENT DOCUMENTS

CN    102970009 A    3/2013
TW       I220591 B   8/2004

* cited by examiner

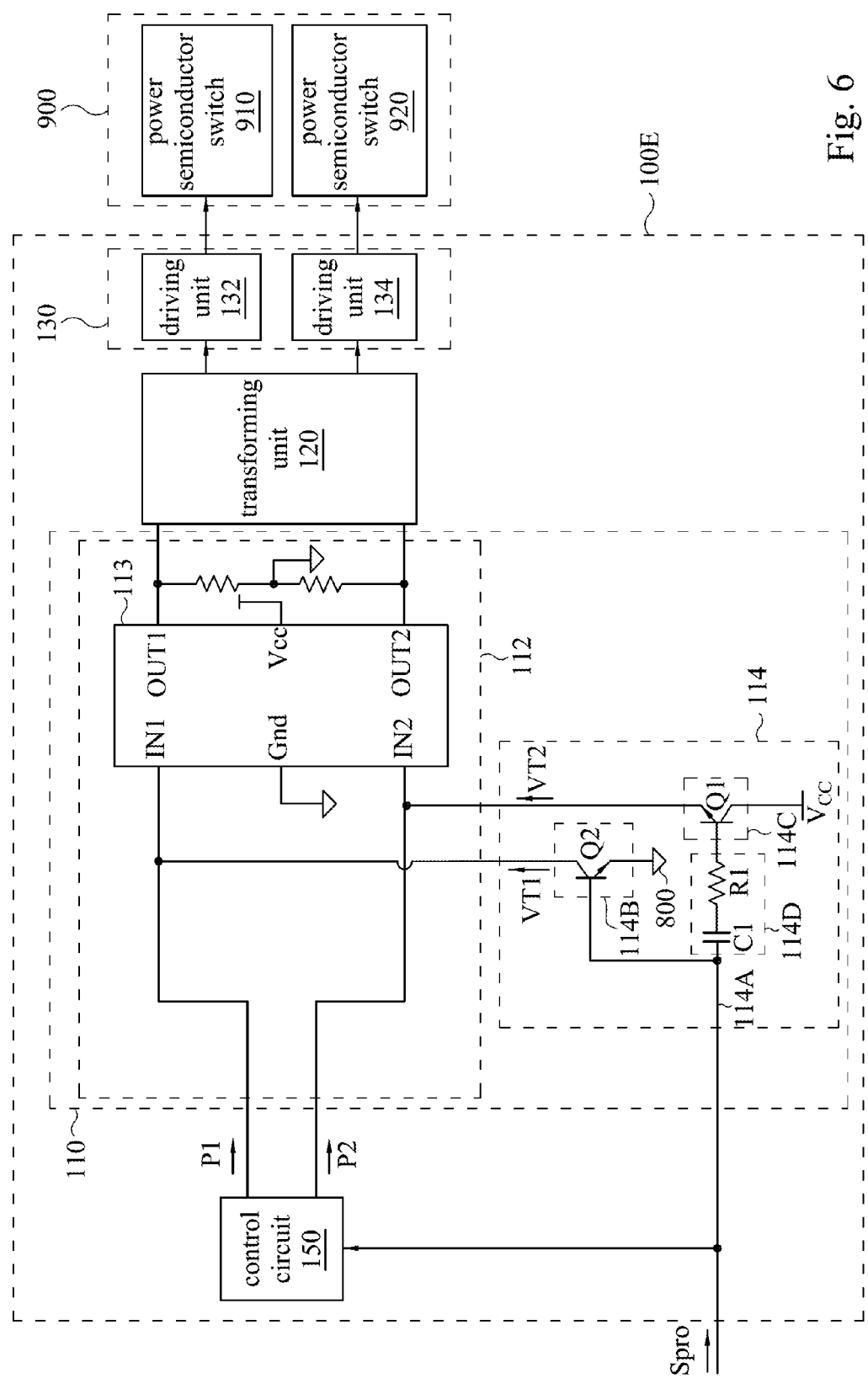

DRIVING DEVICE AND DRIVING METHOD

RELATED APPLICATIONS

This application claims priority to Chinese Application Serial Number 201410292828.9, filed Jun. 25, 2014, which is herein incorporated by reference.

BACKGROUND

Field of Invention

The present invention relates to an electronic device and a method for controlling the same. More particularly, the present invention relates to a driving device and a driving method.

Description of Related Art

In the driving device of serially-connected insulated gate bipolar transistors (IGBTs), the way of transmitting the driving signal plays a critical role. If an error occurs in the transmission process of the driving signal, the driving device cannot effectively control the serially-connected IGBTs.

Generally, the driving device may use a logic level signal with a high-to-low voltage level, e.g. the pulse-width-modulation (PWM) signal, as a control signal for driving the serially-connected IGBTs. Briefly, the transmission process of the PWM signal modulates the PWM signal into a positive-negative pulse signal, which is transmitted using a transformer, and then the positive-negative pulse signal is demodulated by a demodulating circuit to obtain the driving signal. Subsequently, the above-mentioned driving signal is used to drive the serially-connected IGBTs.

However, the driving device is in an abnormal status generates severe electromagnetic interruption; in this case, the last negative pulse signal of the modulated PWM signal will be interfered and hence cannot be successfully demodulated by the demodulating circuit. As such, the serially-connected IGBT that should have been turned off will not be turned off.

In view of the foregoing, problems and disadvantages associated with existing products still await improvements and solutions that those skilled in the art have been looking for.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is directed to a driving device, which is configured to drive the power semiconductor switch module based on a main control signal. Said driving device comprises a voltage-modulating unit and a driving module. When the voltage-modulating unit receives the protection signal, the voltage-modulating unit generates a turn-off pulse signal based on the protection signal. Moreover, said driving module is configured to turn off the power semiconductor switch module based on the turn-off pulse signal.

Another aspect of the present disclosure is directed to a driving method. Said driving method drives a power semiconductor switch module based on a main control signal. Said driving method comprises the following steps: when receiving a protection signal, generating a turn-off pulse signal based on the protection signal; and turning off the power semiconductor switch module based on the turn-off pulse signal.

In view of the foregoing, embodiments of the present disclosure provide a driving device and a driving method to improve the problems of failure to drive the power semiconductor switch module correctly caused by the driving signal being interrupted during the transmission process.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows:

FIG. 6 is a schematic diagram of a driving device according to still another embodiment of the present disclosure;

FIG. 10 is a schematic diagram of a driving device according to another embodiment of the present disclosure;

Figure 1A:
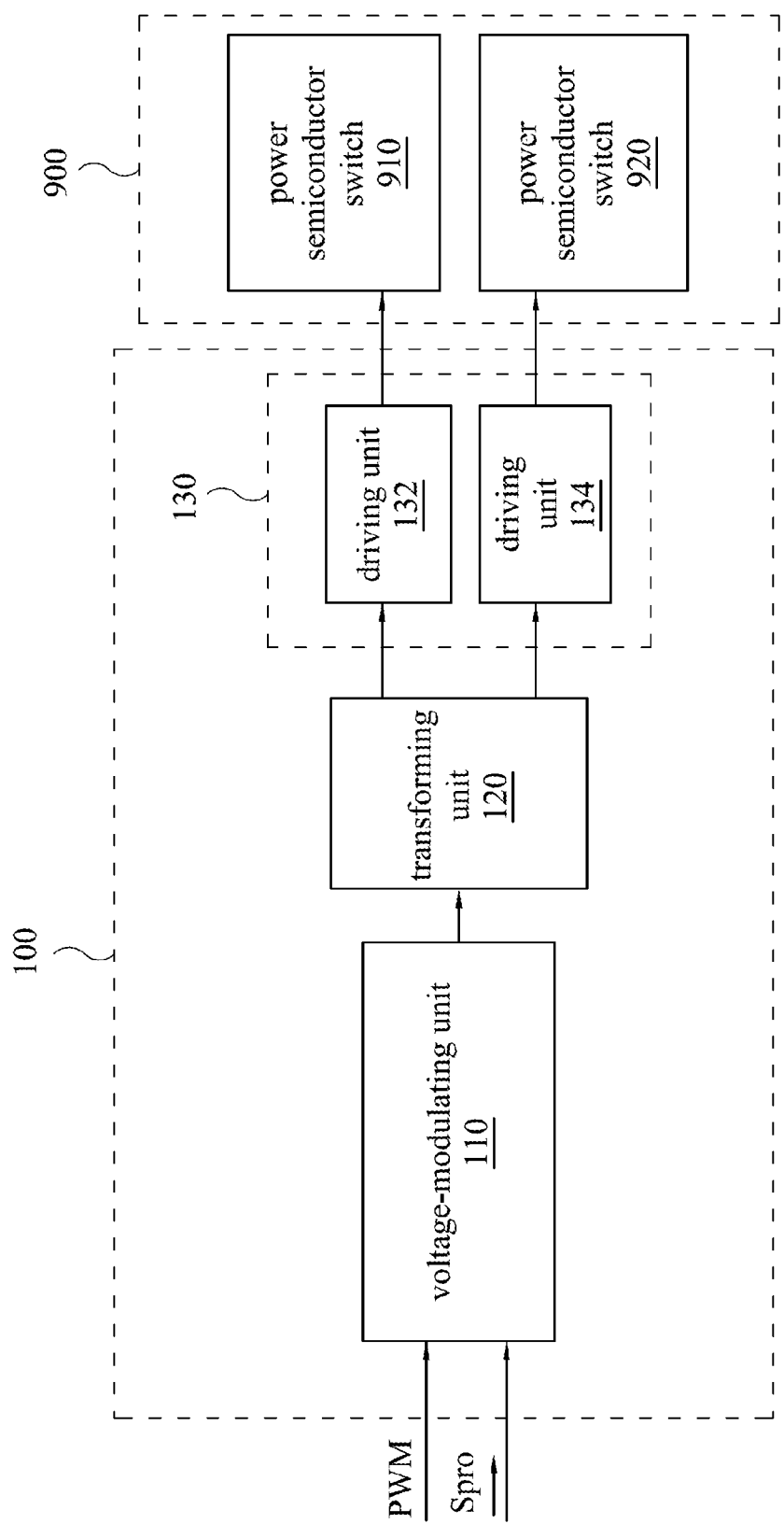
FIG. 1A is a schematic diagram of a driving device according to one embodiment of the present disclosure.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular Further, as used herein, the term "couple" refers to the direct or indirect physical or electrical contact between or among two or more components, or the mutual operation or action of two or more components.

To address the problems of failure to drive the power semiconductor switch module correctly caused by the driving signal being interrupted during the transmission process, the present disclosure provides a driving device; the driving mechanism of said driving device can normally drive the switch component despite the occurrence of the interruption. Said driving device and driving mechanism thereof are described in detail hereinbelow.

FIG. 1A is a schematic diagram of a driving device 100 according to one embodiment of the present disclosure. Generally, the driving device 100 drives the power semiconductor switch module 900 based on the main control signal PWM (a logic level signal with a high-to-low voltage level). As illustrated in FIG. 1A, the driving device 100 comprises a voltage-modulating unit 110, a transforming unit 120 and a driving module 130. Regarding the structural connection, the voltage-modulating unit 110 is coupled with the transforming unit 120, and the transforming unit 120 is coupled with the driving module 130.

In operation, when the voltage-modulating unit 110 receives the protection signal $S_{pro}$, the voltage-modulating unit 110 generates a turn-off pulse signal based on the protection signal $S_{pro}$. Subsequently, the transforming unit 120 transmits the turn-off pulse signal from the voltage-modulating unit 110 to the driving module 130. The driving module 130 turns off the power semiconductor switch module 900 based on the turn-off pulse signal.

In one embodiment, said turn-off pulse signal can be a negative pulse signal. Said negative pulse signal is not limited to the types of current or voltage. Moreover, the pulse-width of said negative pulse signal is wider than the pulse-width of the negative-narrow pulse signal that is commonly used to turn off the power semiconductor switch module. Subsequently, the driving module 130 turns off the power semiconductor switch module 900 based on the wider negative pulse signal.

In this way, even when the main control signal is interrupted during the transmission process, once the voltage-modulating unit 110 of the driving device 100 receives the protection signal $S_{pro}$, the voltage-modulating unit 110 generates a turn-off pulse signal, and since the pulse-width of the turn-off pulse signal is wider, it can make sure that the driving module 130 can effectively turn off the power semiconductor switch module 900 based on the turn-off pulse signal.

Referring to FIG. 1A, in one embodiment, if the voltage-modulating unit 110 does not receive the protection signal $S_{pro}$, the main control signal PWM would be modulated into the positive-narrow pulse signal and the negative-narrow pulse signal by the voltage-modulating unit 110, wherein the positive-narrow pulse signal is a turn-on pulse signal (for example, the width of the turn-on pulse signal can be any value of 50 ns-10 μs) configured to turn on the power semiconductor power module 900; the negative-narrow pulse signal is a turn-off pulse signal (for example, the width of the turn-off pulse signal can be any value of 50 ns-10 μs) configured to turn off the power semiconductor switch module 900, and the positive-narrow pulse signal and the negative-narrow pulse signal are transmitted to the driving module 130 via the transforming unit 120. Subsequently, the driving module 130 demodulates and amplifies the positive-narrow pulse signal and the negative-narrow pulse signal to generate the driving signal for turning-on and turning-off the power semiconductor switch module 900. In the present embodiment, when the driving module 130 receives the positive-narrow pulse signal, the received positive-narrow pulse signal is latched at a high voltage level, and when the driving module 130 receives the negative-narrow pulse signal, the received negative-narrow pulse signal is latched at a low voltage level. In other words, the driving module 130 restores the received positive-narrow pulse signal and negative-narrow pulse signal into the driving signal having the high-to-low voltage level, and amplifies the driving signal, thereby allowing it to drive the power semiconductor switch module 900.

In another embodiment, the driving module 130 may comprise a driving unit 132 and a driving unit 134, and the power semiconductor switch module 900 may comprise a power semiconductor switch 910 and a power semiconductor switch 920. Regarding the structural connection, the driving unit 132 is coupled with the power semiconductor switch 910, while the driving unit 134 is coupled with the power semiconductor switch 920. In operation, the driving unit 132 is configured to drive the power semiconductor switch 910, while the driving unit 134 is configured to drive the power semiconductor switch 920. However, the present disclosure is not limited to the circuit arrangement shown in FIG. 1A, persons having ordinary skill in the art may flexibly arrange the number of the power semiconductor switch in the power semiconductor switch module 900 and arrange the number of the driving unit in the driving module 130 correspondingly depending on the actual needs, so as to allow the driving module 130 may effectively drive the power semiconductor switch module 900.

On the other hand, the power semiconductor switch 910 and the power semiconductor switch 920 can be serially-connected, said two serially-connected power semiconductor switches 910, 920 can be a part of an upper-bridge arm/lower-bridge arm, or they can be the whole upper-bridge arm/lower-bridge arm. Further, the power semiconductor switch module 900 may only comprise a single power semiconductor switch, and correspondingly, the driving module 130 may only comprise a single driving unit, depending on the actual needs.

Figure 1B:
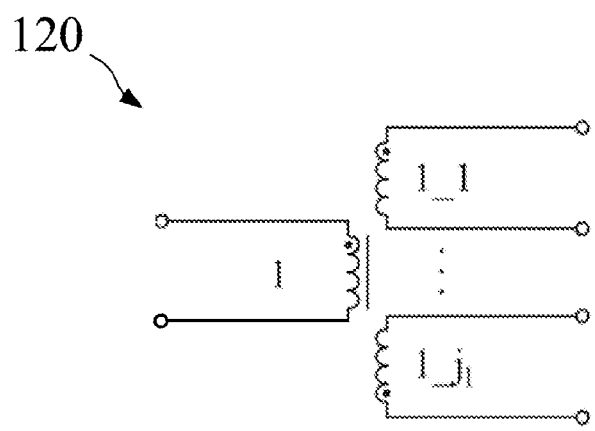
FIG. 1B is a schematic diagram of a transforming unit of a driving device according to yet another embodiment of the present disclosure.

FIG. 1B is a schematic diagram of a transforming unit 120 of a driving device 100 according to another embodiment of the present disclosure. It should be noted that, the transforming unit 120 illustrated in FIG. 1A can be implemented by the structure shown in FIG. 1B. As illustrated, the transformer of said transforming unit 120 comprises a primary winding and at least one secondary winding. For example, the transformer comprises a primary winding 1 and the secondary winding(s) $1\_1 \sim 1\_j_1$, where $j_1$ is a positive integer, and so on. Moreover, the primary winding 1 of said transformer is coupled with the voltage-modulating unit 110, while the secondary winding $1\_1 \sim 1\_1_1$ of the transformer is coupled with the driving unit 132, 134 of the driving module 130. In another embodiment, the transforming unit 120 may also comprise a plurality of transformers, the structure of these transformer is the same as the structure shown in FIG. 1B, and hence will not be described herein in detail; the primary windings of these transformer are serially-connected, and the two terminals of the structure composed of the serially-connected primary windings are electrically coupled with the voltage-modulating unit 110.

Figure 1C:
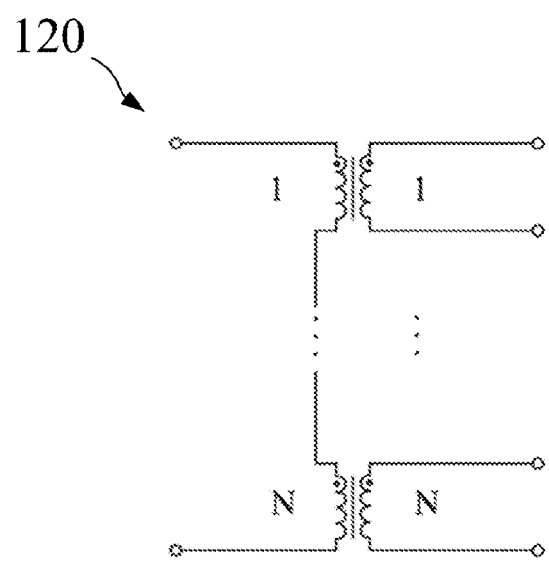

FIG. 1C is a schematic diagram of a transforming unit 120 of a driving device 100 according to yet another embodiment of the present disclosure. It should be noted that, the transforming unit 120 illustrated in FIG. 1A can be implemented by the structure shown in FIG. 1C. As illustrated, the transforming unit 120 may comprise N transformers; each transformer comprises a primary winding and a secondary winding. Moreover, the primary windings of all the transformers are serially-connected, and the two terminals of the structure composed of the serially-connected primary windings are electrically coupled with the voltage-modulating unit 110. On the other hand, each secondary winding of each transformer is electrically coupled with the driving unit 132, 134 of the driving module 130. However, the present disclosure is not limited to the circuit arrangement shown in FIG. 1B and FIG. 1C, which is only provided to exemplify one embodiment of the present disclosure.

Figure 2:
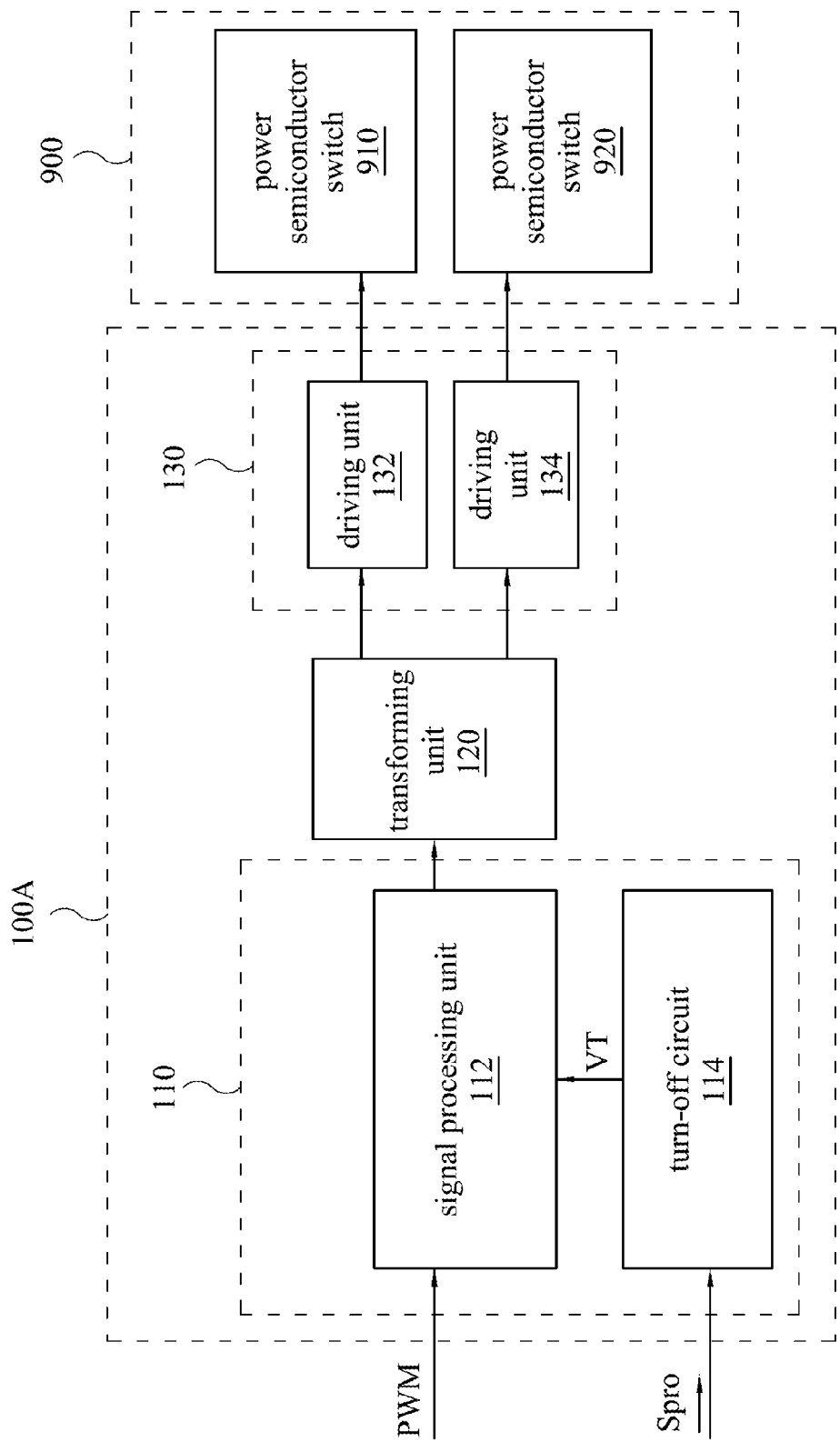
FIG. 2 is a schematic diagram of a driving device according to another embodiment of the present disclosure.

FIG. 2 is a schematic diagram of a driving device 100A according to another embodiment of the present disclosure. Compared with FIG. 1A, FIG. 2 illustrates an implementation of the voltage-modulating unit 110. As illustrated in FIG. 2, the voltage-modulating unit 110 comprises a signal processing unit 112 and a turn-off circuit 114. Regarding the structural connection, the signal processing unit 112 is coupled between the turn-off circuit 114 and the transforming unit 120. In operation, the signal processing unit 112 receives the main control signal PWM. Moreover, the turn-off circuit 114 receives the protection signal $S_{pro}$ and generates a driving-regulating signal VT based on the protection signal $S_{pro}$. Subsequently, the signal processing unit 112 generates a turn-off pulse signal based on the driving-regulating signal VT. Said turn-off pulse signal is transmitted to the driving module 130 via the transforming unit 120 to turn off the power semiconductor switch module 900. However, the present disclosure is not limited to the circuit arrangement shown in FIG. 2, which is only provided to exemplify one embodiment of the present disclosure.

Figure 3:
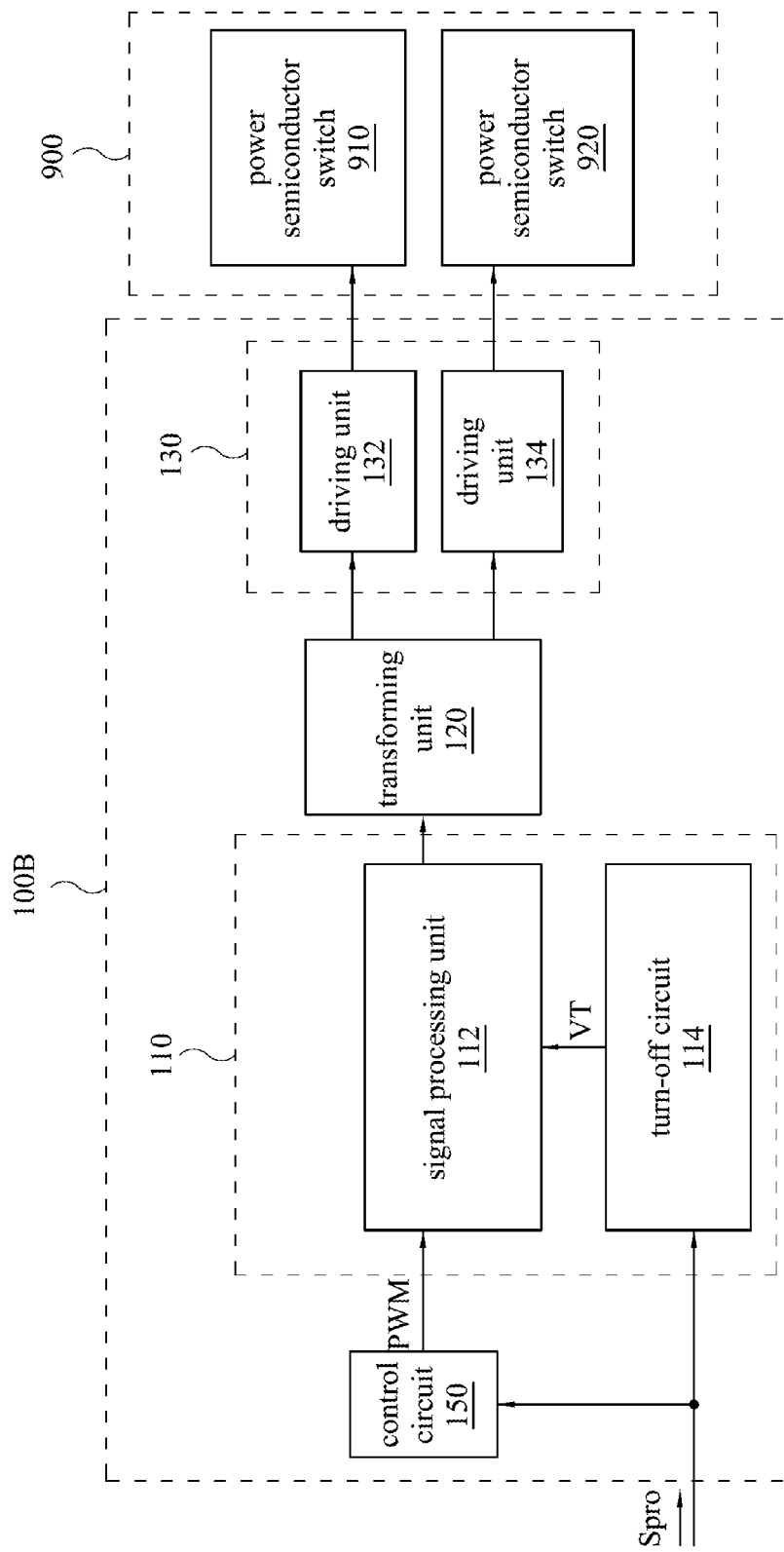
FIG. 3 is a schematic diagram of a driving device according to yet another embodiment of the present disclosure.

FIG. 3 is a schematic diagram of a driving device 100B according to embodiments of the present disclosure. Compared with the driving device 100A shown in FIG. 2, the driving device 100B of FIG. 3 further comprises a control circuit 150. Regarding the structural connection, the control circuit 150 is coupled with the signal processing unit 112. In operation, initially, the control circuit 150 is used to provide the main control signal PWM to the signal processing unit 112. However, once the control circuit 150 receives the protection signal $S_{pro}$, the control circuit 150 stops providing the main control signal PWM to the signal processing unit 112. However, the present disclosure is not limited to the circuit arrangement shown in FIG. 3, which is only provided to exemplify one embodiment of the present disclosure.

It should be noted that the power semiconductor switch module 900 shown in FIG. 3 is only one power semiconductor switch module of the inverter. In practice, the inverter may comprise a plurality of power semiconductor switch modules (not shown), and these power semiconductor switch module can be serially-connected, and each power semiconductor switch module may comprise one or more power semiconductor switches, these power semiconductor switches can be connected in series or in parallel, and the control circuit 150, after receiving the protection signal $S_{pro}$, can turn off all the power semiconductor switch modules in the whole inverter, so that the whole system stops operating.

Figure 4:
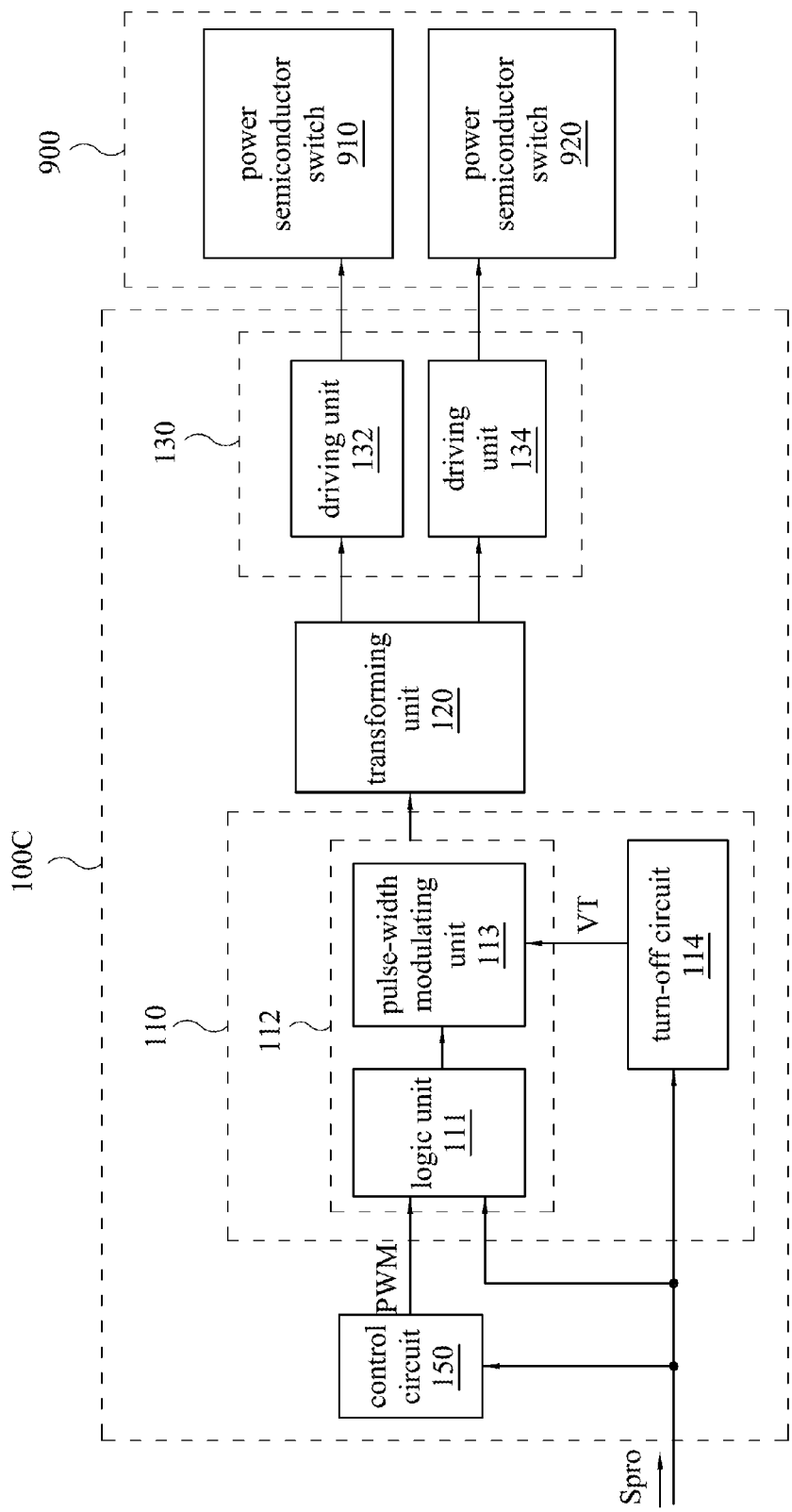
FIG. 4 is a schematic diagram of a driving device according to still another embodiment of the present disclosure.

FIG. 4 is a schematic diagram of a driving device 100C according to embodiments of the present disclosure. Compared with FIG. 3, FIG. 4 illustrates one implementation of the signal processing unit 112. As illustrated in FIG. 4, the signal processing unit 112 comprises a logic unit 111 and a pulse-width modulating unit 113. Regarding the structural connection, the control circuit 150 is coupled with the logic unit 111, the logic unit 111 is coupled with the pulse-width modulating unit 113, and the pulse-width modulating unit 113 is coupled between the turn-off circuit 114 and the transforming unit 120. In operation, the pulse-width modulating unit 113 receives the driving-regulating signal and generates a turn-off pulse signal based on the driving-regulating signal VT. Said turn-off pulse signal is transmitted to the driving module 130 via the transforming unit 120 to turn off the power semiconductor switch module 900.

In one embodiment, referring to FIG. 4, initially, the logic unit 111 is used to receive the main control signal PWM and provide the main control signal PWM to the pulse-width modulating unit 113. However, once the logic circuit 111 receives the protection signal $S_{pro}$, the logic unit 111 performs logic operation to the main control signal PWM and protection signal $S_{pro}$ so as to stop providing the main control signal PWM to the pulse-width modulating unit 113. For example, the logic unit 111 can be implemented using the NOR scheme. After the logic unit 111 receives the protection signal $S_{pro}$, the logic unit 111 firstly performs logic operation to the protection signal $S_{pro}$ and the main control signal PWM, so as to stop providing the main control signal PWM. In other words, the logic unit 111 outputs a low level signal.

In another embodiment, the control circuit 150 and the logic unit 111 may receive the protection signal $S_{pro}$ at the same time. Subsequently, the logic unit 111 stops providing the main control signal PWM to the pulse-width modulating unit 113, while the control circuit 150, after receiving the protection signal $S_{pro}$, stops providing the main control signal PWM to the logic unit 111, so as to turn off all the power semiconductor switch modules of the whole inverter, so that the whole system stops operating. However, the present disclosure is not limited to the circuit arrangement shown in FIG. 4, which is only provided to exemplify one embodiment of the present disclosure.

Figure 5A:
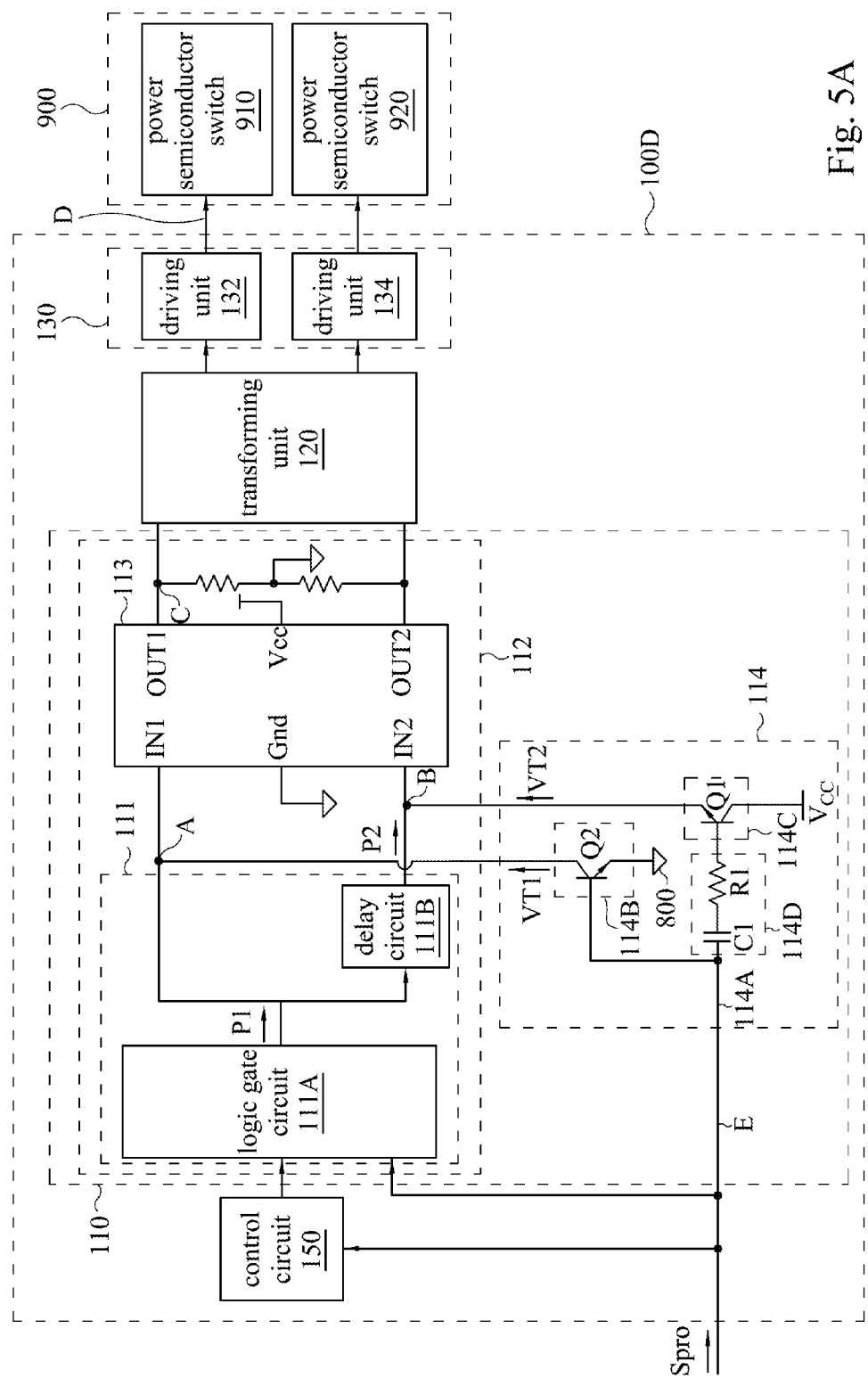
FIG. 5A is a schematic diagram of a driving device according to yet another embodiment of the present disclosure.

FIG. 5A is a schematic diagram of a driving device 100D according to embodiments of the present disclosure. Compared with FIG. 4, FIG. 5A illustrates an implementation of a logic unit 111. As illustrated in FIG. 5A, the logic unit 111 receives the main control signal PWM, so as to output the first control signal P1 and the second control signal P2. The output time of the first control signal P1 and the output time of the second control signal P2 are spaced by a pre-determined delay time. Said pre-determined time can be determined depending on actual conditions. When the logic unit 111 receives the protection signal $S_{pro}$, the logic unit 111 performs logic operation to the main control signal PWM and the protection signal $S_{pro}$, so as to stop outputting the first control signal P1 and the second control signal P2.

Still referring to FIG. 5A, the logic unit 111 may comprise a logic gate circuit 111A and a delay circuit 111B. Regarding the structural connection, the logic gate circuit 111A is coupled between the control circuit 150 and the delay circuit 111B. In operation, the logic gate circuit 111A receives the main control signal PWM to output the first control signal P1. On the other hand, the delay circuit 111B is configured to receive and perform delay operation to the first control signal P1 to generate a second control signal P2. Therefore, the output time of the first control signal P1 and the output time of the second control signal P2 are spaced by a pre-determined delay time.

Further, compared with FIG. 4, FIG. 5A illustrates one implementation of the pulse-width modulating unit 113 and the turn-off circuit 114. As illustrated in FIG. 5A, the pulse-width modulating unit 113 comprises a first input terminal IN1 and a second input terminal IN2. Regarding the structural connection, the first input terminal IN1 of the pulse-width modulating unit 113 is coupled with the logic gate circuit 111A, while the second input terminal IN2 is coupled with the delay circuit 111B. In operation, the turn-off circuit 114 is configured to receive the protection signal and generate a first driving-regulating signal VT1 and a second driving-regulating signal VT2 based on the protection signal $S_{pro}$. Moreover, the first input terminal IN1 can receive the first control signal P1 and the first driving-regulating signal VT1, while the second input terminal IN2 can receive the second control signal P2 and the second driving-regulating signal VT2. When the turn-off circuit 114 receives the protection signal $S_{pro}$, the pulse-width modulating unit 113 generates a turn-off pulse signal based on the first driving-regulating signal VT1 and the second driving-regulating signal VT2.

In one embodiment, referring to FIG. 5A, the turn-off circuit 114 comprises an input terminal 114A, a level-lowering unit 114B and a level-elevating unit 114C. Regarding the structural connection, the level-lowering unit 114B is coupled between the input terminal 114A and the first input terminal IN1 of the pulse-width modulating unit 113, and the level-elevating unit 114C is coupled between the input terminal 114A and the second input terminal IN2 of the pulse-width modulating unit 113. In operation, when the level-lowering unit 114B receives the protection signal $S_{pro}$, the level-lowering unit 114B outputs the first driving-regulating signal VT1 to the first input terminal IN1 of the pulse-width modulating unit 113, thereby lowering the first input terminal IN1 to a low level. On the other hand, wherein when level-elevating unit 114C receives the protection signal $S_{pro}$, the level-elevating unit 114C outputs the second driving-regulating signal VT2 to the second input terminal IN2 of the pulse-width modulating unit 113, thereby elevating the second input terminal IN2 to the high level. Then, the pulse-width modulating unit 113 generates a turn-off pulse signal based on the first driving-regulating signal VT1 and the second driving-regulating signal VT2; that is, the pulse-width modulating unit 113 generates a turn-off pulse signal based on the low level of the first input terminal IN1 and the high level of the second input terminal IN2. Said turn-off pulse signal is transmitted to the driving module 130 via the transforming unit 120 to turn off the power semiconductor switch module 900.

In another embodiment, referring to FIG. 5A, the level-lowering unit 114B comprises a transistor Q2. Said transistor Q2 comprises a first terminal, a control terminal and a second terminal. Regarding the structural connection, the first terminal is coupled with the first input terminal IN1 of the pulse-width modulating unit 113, the control terminal is coupled with the input terminal 114A of the turn-off circuit 114, and the second terminal is coupled with the ground terminal 800. In yet another embodiment, the level-elevating unit 114C comprises a transistor Q1. Said transistor Q1 comprises a first terminal, a control terminal, and a second terminal. Regarding the structural connection, the first terminal is coupled with the second input terminal IN2 of the pulse-width modulating unit 113, and the control terminal is coupled with the input terminal 114A of the turn-off circuit 114. On the other hand, the second terminal can be configured to receive the power supply $V_{cc}$.

In still another embodiment, referring to FIG. 5A, the turn-off circuit 114 further comprises a pulse-width modulator 114D. Said pulse-width modulator 114D is coupled between the input terminal 114A of the turn-off circuit 114 and the control terminal of the transistor Q1, and is configured to adjust the pulse-width of turn-off pulse signal. For example, the pulse-width modulator 114D comprises a capacitor C1 and a resistor R1, and the capacitor C1 and resistor R1 respectively comprise a first terminal and a second terminal. Regarding the structural connection, the first terminal of the capacitor C1 is coupled with the input terminal 114A of the turn-off circuit 114, the first terminal of the resistor R1 is coupled with the second terminal of the capacitor C1, while the second terminal of the resistor R1 is coupled with the control terminal of the transistor Q1. However, the present disclosure is not limited to the circuit arrangement shown in FIG. 5A, which is only provided to exemplify one embodiment of the present disclosure.

Figure 5C:
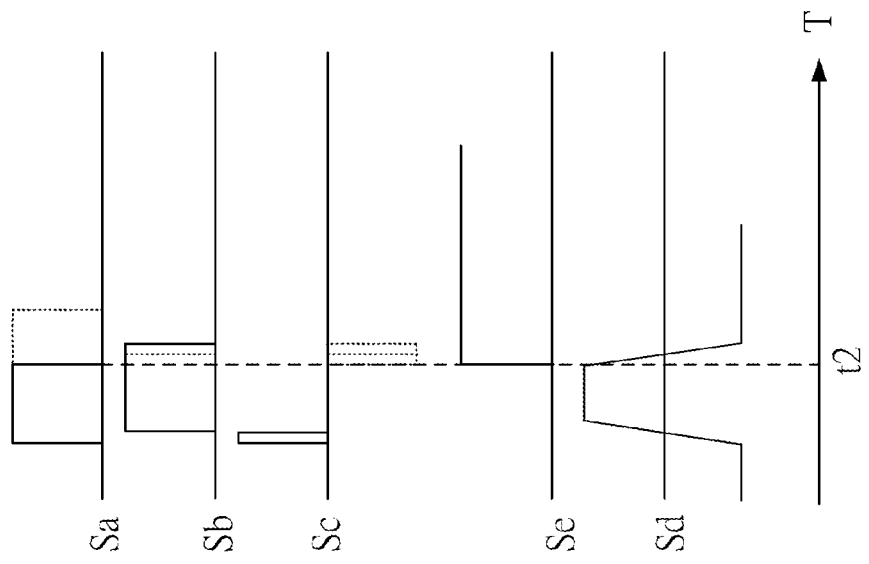
FIG. 5C is a schematic diagram of the waveform of a driving device according to yet another embodiment of the present disclosure.
Figure 5B:
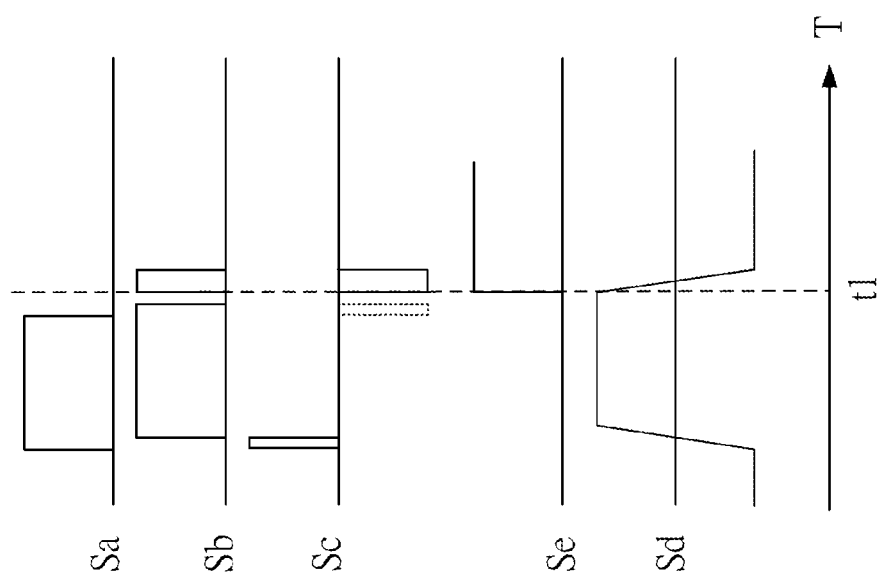
FIG. 5B is a schematic diagram of the waveform of a driving device according to another embodiment of the present disclosure.

FIG. 5B is a schematic diagram of the waveform of the driving device 100D according to embodiments of the present disclosure. As illustrated in FIG. 5B, the schematic waveform of the driving device 100D is measured when the protection signal $S_{pro}$ arrives after the main control signal PWM wave (during the turn-off process). More specifically, in FIG. 5B, waveforms Sa~Se respectively corresponds to the waveforms measured at points A-E marked in FIG. 5A. Referring to FIG. 5B, at t1, the waveform Sa of the main control signal PWM is at low level, indicating that at time point t1, the main control signal PWM has completed. Moreover, referring to the waveforms Se of the protection signal $S_{pro}$, at time point t1, the protection signal $S_{pro}$ is generated. In this case, the voltage-modulating unit 110 generates a positive-narrow pulse signal, a negative-narrow pulse signal and a turn-off pulse signal based on the main control signal PWM and the protection signal $S_{pro}$, which are transmitted to the driving module 130 via the transforming unit 120, and demodulated and amplified by the driving module 130, so as to generate a driving signal for turning on and turning off the power semiconductor switches 910, 920 of the power semiconductor switch module 900.

FIG. 5C is a schematic diagram of the waveform of the driving device 100D according to embodiments of the present disclosure. As illustrated in FIG. 5C, the schematic waveform of the driving device 100D is measured when the protection signal $S_{pro}$ arrives during the main control signal PWM wave (during the turn-on process). Similarly, waveforms Sa~Se respectively corresponds to the waveforms measured at points A~E marked in FIG. 5A. Referring to FIG. 5C, at time point t1, the waveforms Sa of the main control signal PWM is at the high level, indicating that it's during the turn-on process. At the same time, at time point t1, the protection signal $S_{pro}$ is generated. In this case, the voltage-modulating unit 110 generates a positive-narrow pulse signal and a turn-off pulse signal based on the main control signal PWM and the protection signal $S_{pro}$, which is transferred to the driving module 130 via the transforming unit 120, and demodulated and amplified by the driving module 130 so as to generate a driving signal for turning on and turning off the power semiconductor switch modules 910, 920 of the power semiconductor switch module 900.

FIG. 6 is a schematic diagram of a driving device 100 100E according to embodiments of the present disclosure. Compared with the driving device 100D of FIG. 5A, the signal processing unit 112 of the FIG. 6 may not require the logic unit 111. However, as described in detail hereinbelow, the operation method of the control circuit 150 is slightly different. Said control circuit 150 outputs the first control signal P1 and the second control signal P2. In the embodiment, the main control signal comprises the first control signal P1, the second control signal P2. The output time of the first control signal P1 and the output time of the second control signal P2 are spaced by a pre-determined delay time, said pre-determined delay time may be determined depending on actual needs. It should be noted that if the name of the electronic component in FIG. 6 is the same as that in FIG. 5A, it means that the two electronic components have the common electrical operation means, and hence, detailed description thereof is omitted herein for the sake of brevity. In other embodiments, the control circuit 150 outputs the first control signal P1, the signal processing unit 112 further comprises a delay circuit configured to receive and perform delay operation to the first control signal P1 so as to generate a second control signal P2; therefore, the output time of the first control signal P1 and the output time of the second control signal P2 are spaced by said pre-determined delay time.

Figure 7:
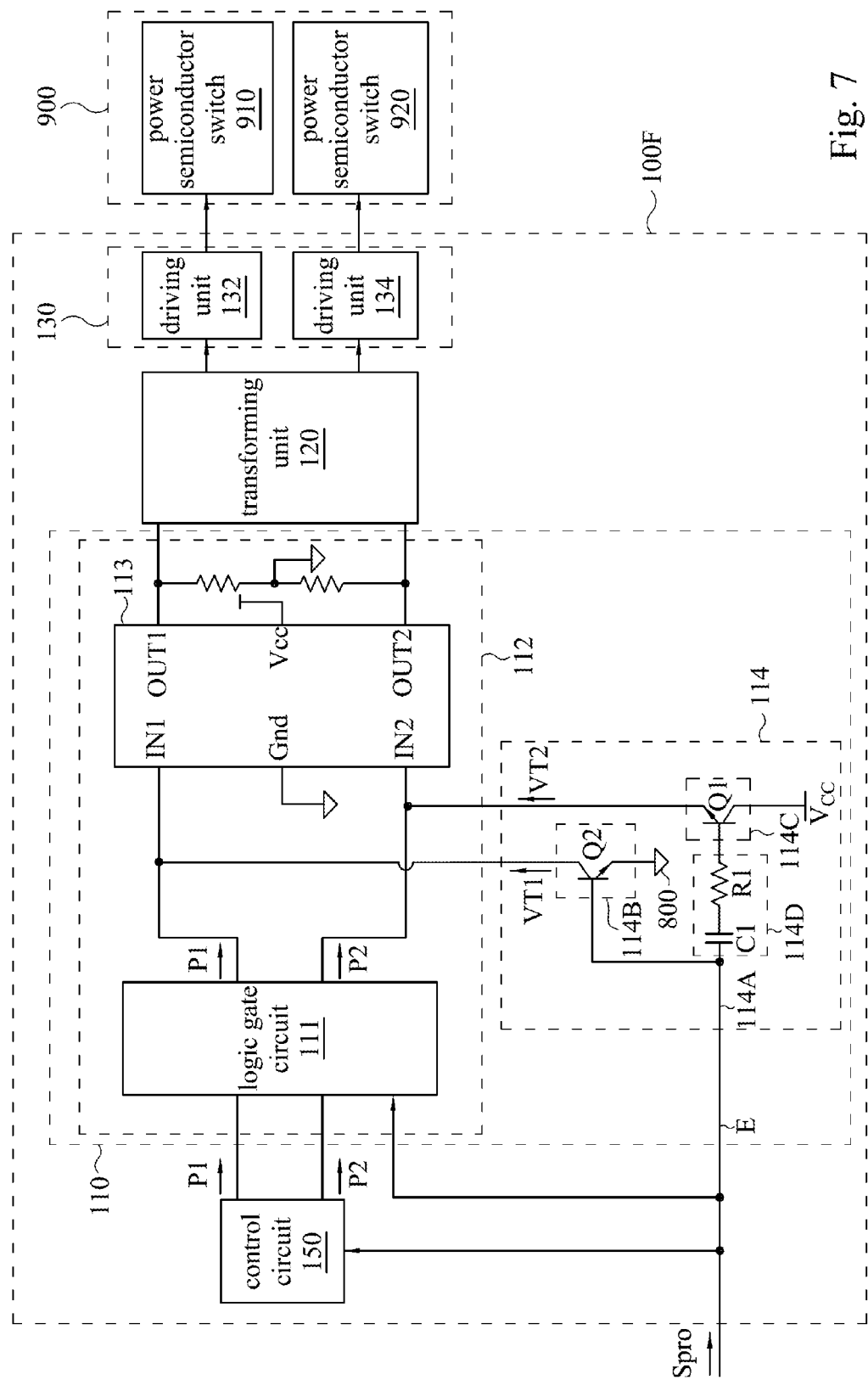
FIG. 7 is a schematic diagram of a driving device according to another embodiment of the present disclosure.

FIG. 7 is a schematic diagram of a driving device 100F according to another embodiment of the present disclosure. Compared with the driving device 100E illustrated in FIG. 6, the signal processing unit 112 of the driving device 100F of FIG. 7 further comprises a logic unit 111, said logic unit 111 is coupled with the control circuit 150 and a pulse-width modulating unit 113, and is configured to receive and provide the first control signal P1 and the second control signal P2. When the logic unit 111 receives the protection signal $S_{pro}$, the logic unit 111 performs logic operation to the first and the second control signals P1, P2 and protection signal $S_{pro}$, so as to stop outputting the first control signal P1 and the second control signal P2. It should be noted that if the name of the electronic component in FIG. 7 is the same as that in FIG. 6, it means that the two electronic components have the common electrical operation means, and hence, detailed description thereof is omitted herein for the sake of brevity.

Figure 8:
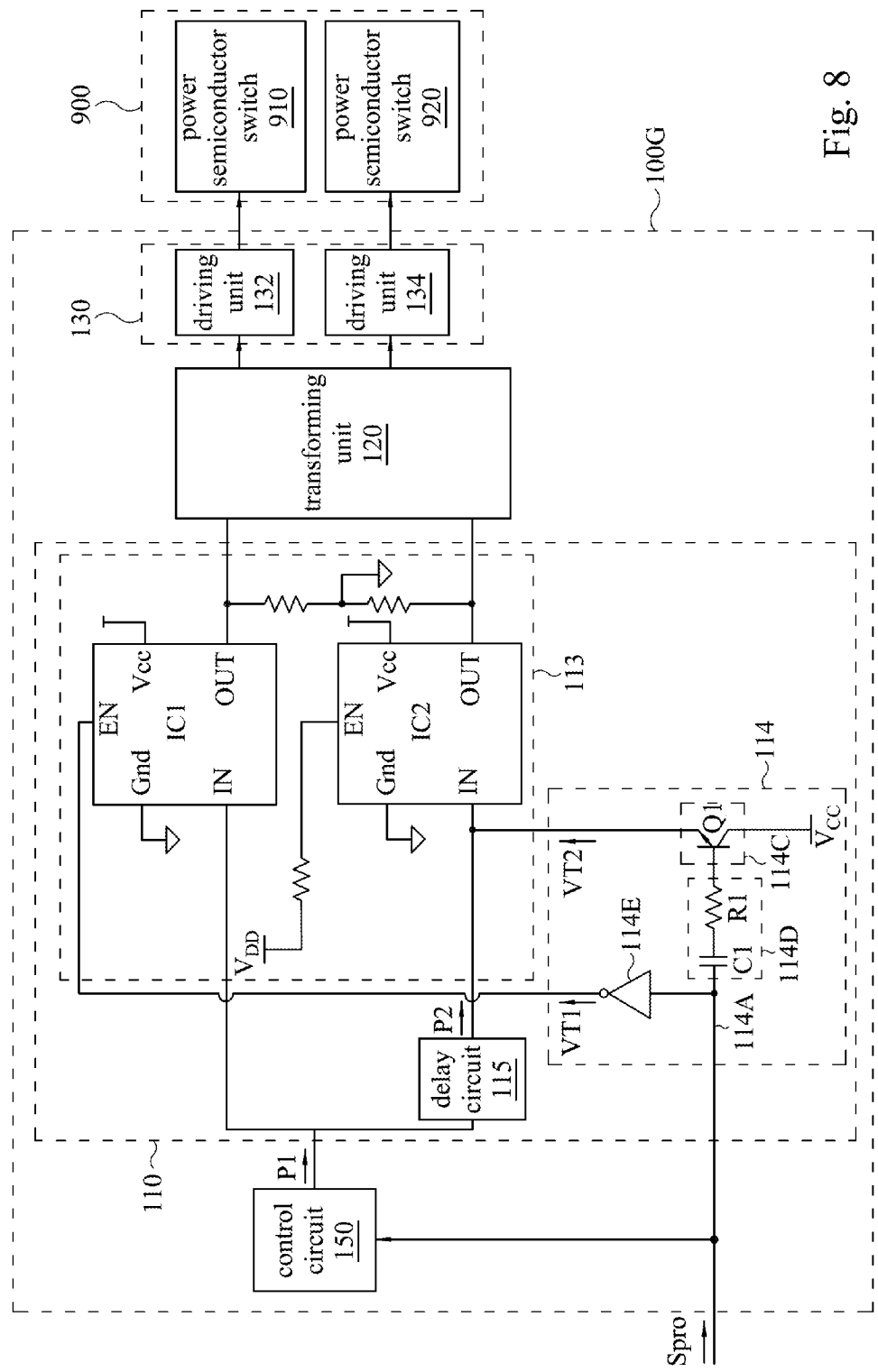
FIG. 8 is a schematic diagram of a driving device according to yet another embodiment of the present disclosure.

FIG. 8 is a schematic diagram of a driving device 100G according to yet another embodiment of the present disclosure. Compared with the driving device 100C illustrated in FIG. 4, one implementation of the pulse-width modulating unit 113 and turn-off circuit 114 is shown in FIG. 8. As illustrated in FIG. 8, the control circuit 150 can be configured to output the first control signal P1, while the voltage-modulating unit 110 comprises a delay circuit 115 and the delay circuit 115 can be configured to receive and perform delay operation to the first control signal P1, so as to generate a second control signal P2. On the other hand, the pulse-width modulating unit 113 comprises a first processing unit IC1 and a second processing unit IC2. Further, the first processing unit IC1 and the second processing unit IC2 respectively comprise an input terminal IN and an enabling terminal EN. Regarding the structural connection, the input terminal IN of the first processing unit IC1 is coupled with the control circuit 150, the enabling terminal EN of the first processing unit IC1 is coupled with the turn-off circuit 114, while the input terminal IN of the second processing unit IC2 is coupled with the delay circuit 115 and the turn-off circuit 114.

In operation, the input terminal IN of the first processing unit IC1 may be configured to receive the first control signal P1, while the enabling terminal EN of the first processing unit IC1 is configured to receive the first driving-regulating signal VT1. On the other hand, the input terminal IN of the second processing unit IC2 may be configured to receive the second control signal P2 and the second driving-regulating signal VT2, while the enabling terminal EN of the second processing unit IC2 is configured to receive the voltage $V_{DD}$. When the turn-off circuit 114 receives the protection signal $S_{pro}$, the turn-off circuit 114 generates a first driving-regulating signal VT1, and the enabling terminal EN of the first processing unit IC1 makes the first processing unit IC1 be in a disabled operation mode based on the first driving-regulating signal VT1; meanwhile, the second processing unit IC2 is in an enabled operation mode, and therefore, the output terminal OUT of the first processing unit IC1 and the output terminal OUT of the second processing unit IC2 generate a turn-off pulse signal based on the first driving-regulating signal VT1 and the second driving-regulating signal VT2.

In one embodiment, referring to FIG. 8, the turn-off circuit 114 comprises a phase inverter 114E. Regarding the structural connection, the phase inverter 114E is coupled between the enabling terminal EN of the first processing unit IC1 and the input terminal 114A of the turn-off circuit 114. In operation, the phase inverter 114E is configured to invert the phase of the protection signal $S_{pro}$ so as to generate a first driving-regulating signal VT1 to the enabling terminal EN of the first processing unit IC1. In another embodiment, the turn-off circuit 114A comprises a level-elevating unit 114C. Regarding the structural connection, the level-elevating unit 114C is coupled between input terminal 114A of the turn-off circuit and the input terminal IN of the second processing unit IC2. In operation, when the level-elevating unit 114C receives the protection signal $S_{pro}$, the level-elevating unit 114C outputs the second driving-regulating signal VT2.

In still another embodiment, referring to FIG. 8, the level-elevating unit 114C comprises a transistor Q1. Said transistor Q1 comprises a first terminal, a control terminal, and a second terminal. Regarding the structural connection, the first terminal is coupled with the input terminal IN of the second processing unit IC2, and the control terminal is coupled with the input terminal 114A of the turn-off circuit 114. On the other hand, the second terminal may be configured to receive the power supply $V_{CC}$. In yet another embodiment, the turn-off circuit 114 further comprises a pulse-width modulator 114D. The pulse-width modulator 114D is coupled between the input terminal 114A of the turn-off circuit 114 and the control terminal of the transistor Q1, and is configured to adjust the pulse-width of turn-off pulse signal. More specifically, the pulse-width modulator 114D comprises a capacitor C1 and a resistor R1, while the capacitor C1 and the resistor R1 respectively comprise a first terminal and a second terminal. Regarding the structural connection, the first terminal of the capacitor C1 is coupled with the input terminal 114A of the turn-off circuit 114, the first terminal of the resistor R1 is coupled with the second terminal of the capacitor C1, while the second terminal of the resistor R1 is coupled with the control terminal of the transistor Q1. However, the present disclosure is not limited to the circuit arrangement shown in FIG. 8, which is only provided to exemplify one embodiment of the present disclosure.

Figure 9:
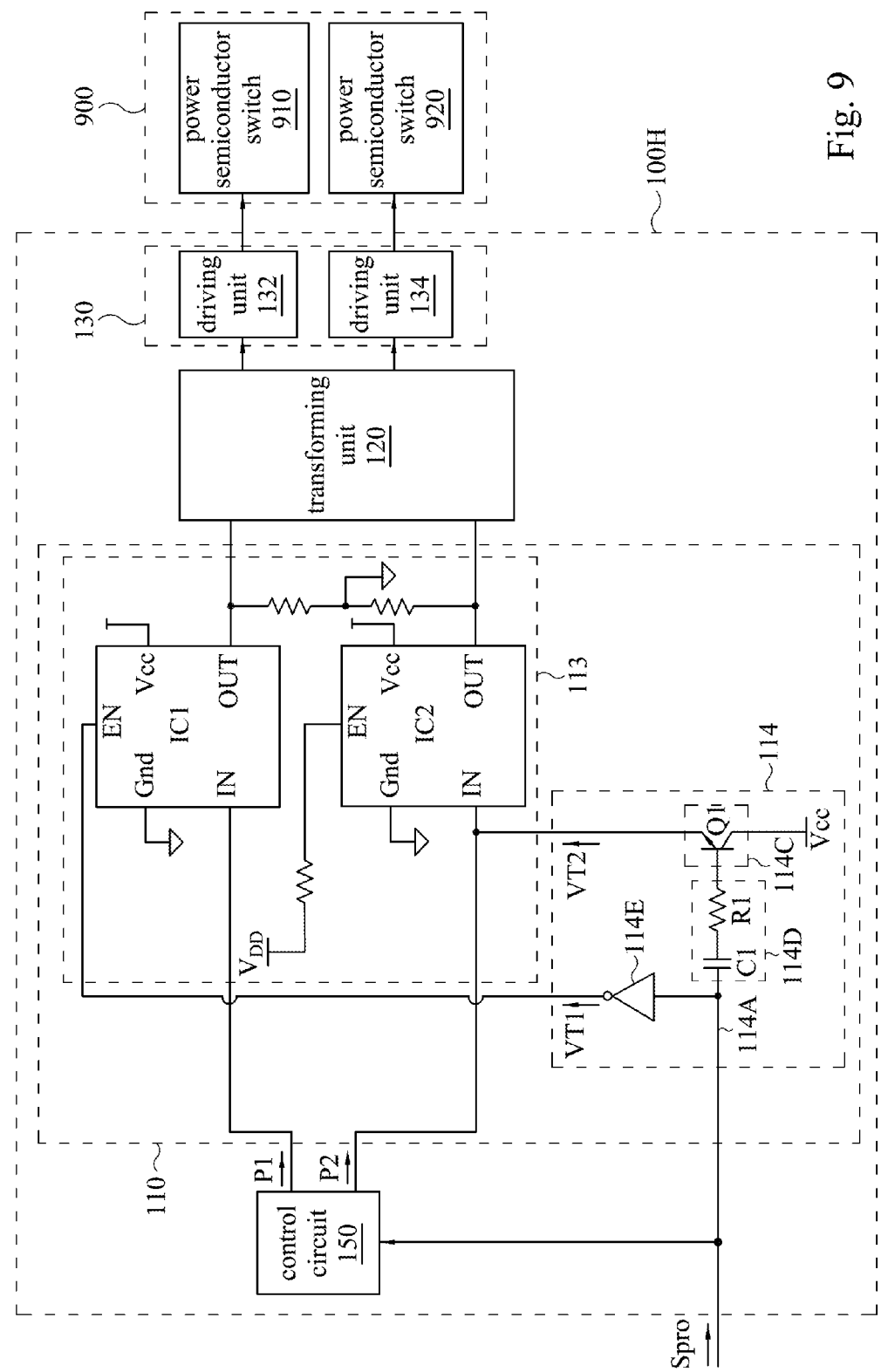
FIG. 9 is a schematic diagram of a driving device according to still another embodiment of the present disclosure.

FIG. 9 is a schematic diagram of a driving device 100H according to embodiments of the present disclosure. Compared with the driving device 100G shown in FIG. 8, the driving device 100H illustrated in FIG. 9 may not require a delay circuit 115. However, as described in detail hereinbelow, the operation method of the control circuit 150 is slightly different. Said control circuit 150 outputs the first control signal P1 and the second control signal P2. The output time of the first control signal P1 and the output time of the second control signal P2 are spaced by a pre-determined delay time, said pre-determined delay time may be determined depending on actual needs. It should be noted that if the name of the electronic component in FIG. 9 is the same as that in FIG. 8, it means that the two electronic components have the common electrical operation means, and hence, detailed description thereof is omitted herein for the sake of brevity.

Figure 10:
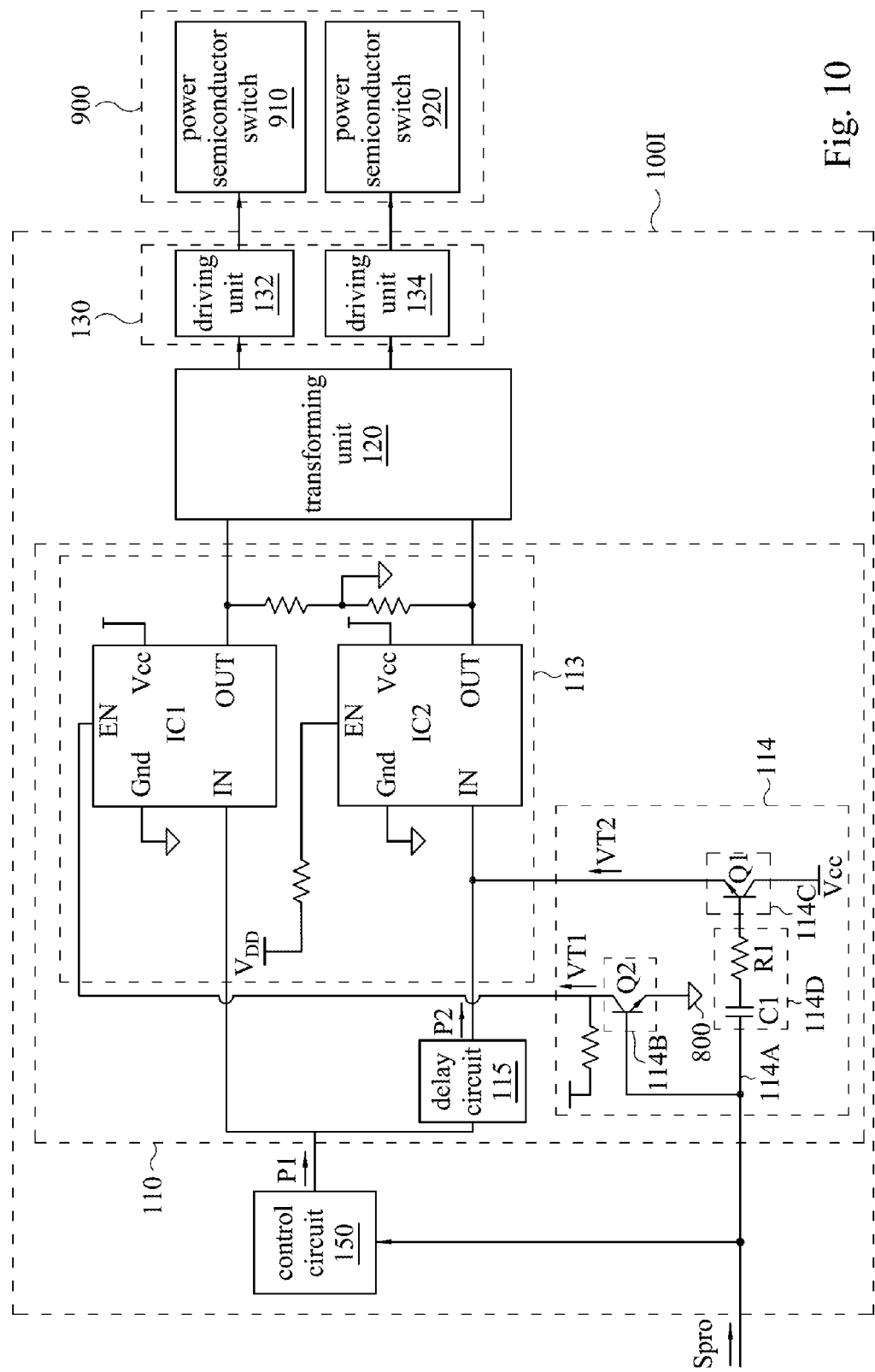
FIG. 10 is a schematic diagram of a transforming unit of a driving device according to still another embodiment of the present disclosure.

FIG. 10 is a schematic diagram of a driving device 100I according to embodiments of the present disclosure. Compared with FIG. 8, in the turn-off circuit 114 of FIG. 10, a level-lowering unit 114B is used to substitute the phase inverter 114E of the turn-off circuit 114 shown in FIG. 8. Said level-lowering unit 114B is coupled between the input terminal 114A and the first processing unit IC1, and is configured to receive a voltage. When the level-lowering unit 114B receives the protection signal $S_{pro}$, the level-lowering unit 114B disables the enabling terminal EN of the first processing unit IC1 so as to generate a first driving-regulating signal VT1, that is, the first processing unit IC1 is in a disabled mode.

In one embodiment, referring to FIG. 10, the level-lowering unit 114B comprises a transistor Q2. Said transistor Q2 comprises a first terminal, a control terminal and a second terminal. Regarding the structural connection, the first terminal is coupled with the enabling terminal EN of the first processing unit IC1, the control terminal is coupled with the input terminal 114A of the turn-off circuit 114, and the second terminal is coupled with ground terminal 800. However, the present disclosure is not limited to the circuit arrangement shown in FIG. 10, which is only provided to exemplify one embodiment of the present disclosure.

Figure 11:
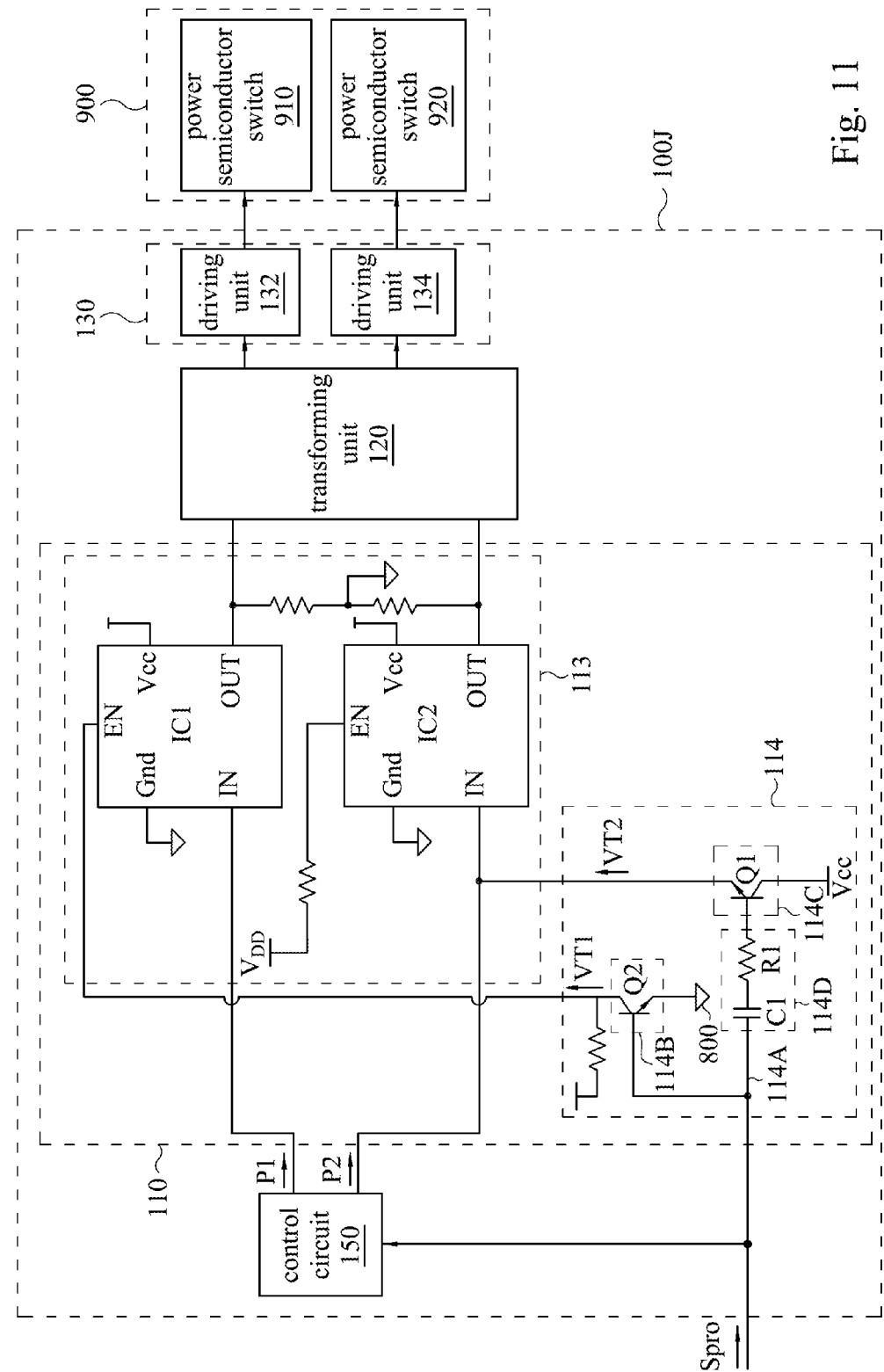
FIG. 11 is a schematic diagram of a driving device according to still another embodiment of the present disclosure.

FIG. 11 is a schematic diagram of a driving device 100J according to embodiments of the present disclosure. Compared with the driving device 100I illustrated in FIG. 10, the driving device 100J shown in FIG. 11 may not require a delay circuit 115. However, as described in detail hereinbelow, the operation method of the control circuit 150 is slightly different. Said control circuit 150 outputs the first control signal P1 and the second control signal P2. The output time of the first control signal P1 and the output time of the second control signal P2 are spaced by a pre-determined delay time, said pre-determined delay time may be determined depending on actual needs. It should be noted that if the name of the electronic component in FIG. 11 is the same as that in FIG. 10, it means that the two electronic components have the common electrical operation means, and hence, detailed description thereof is omitted herein for the sake of brevity.

Figure 12A:
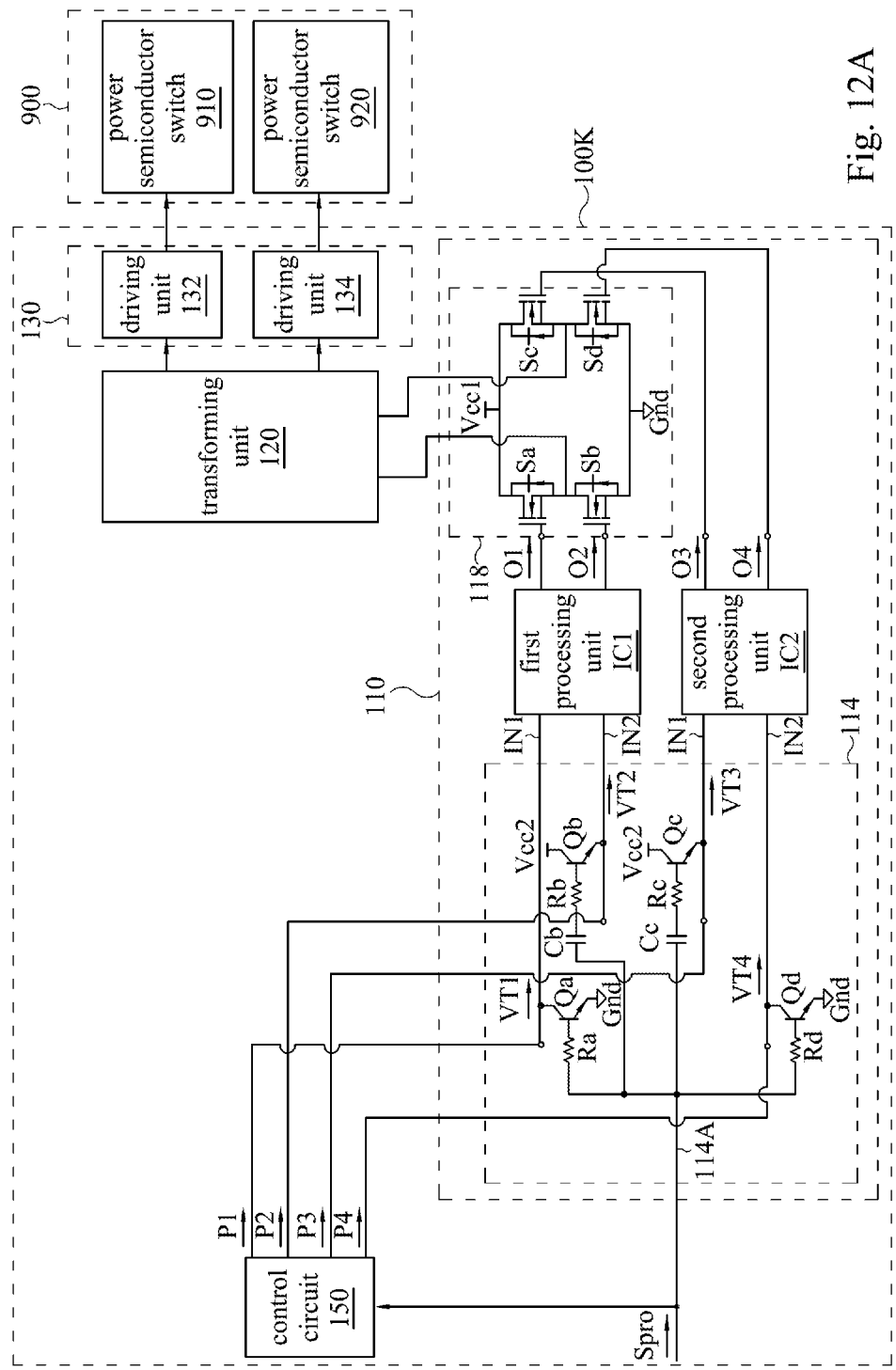
FIG. 12A is a schematic diagram of a driving device according to another embodiment of the present disclosure.

FIG. 12A is a schematic diagram of a driving device 100K according to embodiments of the present disclosure. As illustrated in FIG. 12A, the driving device 100K comprises a voltage-modulating unit 110, a transforming unit 120, and a driving module 130. Regarding the structural connection, the voltage-modulating unit 110 is coupled with the transforming unit 120, and the transforming unit 120 is coupled with the driving module 130.

More specifically, the voltage-modulating unit 110 comprises a turn-off circuit 114, a first processing module IC1, a second processing module IC2 and a full-bridge circuit 118. The first processing module IC1 comprises a first input terminal IN1 and a second input terminal IN2, the second processing module IC2 comprises a first input terminal IN1 and a second input terminal IN2. Regarding the structural connection, the first processing module IC1 and the second processing module IC2 are respectively coupled with the turn-off circuit 114, while the full-bridge circuit 118 is coupled between the first processing module IC1 and the second processing module IC2. In operation, the turn-off circuit 114 is configured to receive the protection signal and generates a first driving-regulating signal VT1, a second driving-regulating signal VT2, a third driving-regulating signal VT3 and a fourth driving-regulating signal VT4 based on the protection signal $S_{pro}$. The first input terminal IN1 of the first processing module IC1 is configured to receive the first control signal P1 and first driving-regulating signal VT1, and generate a first output signal O1 based on the first control signal P1 and first driving-regulating signal VT1. The second input terminal IN2 of the first processing module IC1 is configured to receive the second control signal P2 and the second driving-regulating signal VT2, and generate a second output signal O2 based on the second control signal P2 and the second driving-regulating signal VT2. The first input terminal IN1 of the second processing module IC2 is configured to receive on the third control signal P3 and third driving-regulating signal VT3, and generate a third output signal O3 based on the third control signal P3 and third driving-regulating signal VT3. The second input terminal IN2 of the second processing module IC2 is configured to receive the fourth control signal P4 and fourth driving-regulating signal VT4, and generate a fourth output signal O4 based on the fourth control signal P4 and the fourth driving-regulating signal VT4. In the embodiment, the main control signal comprises the first control signal P1, the second control signal P2, the third control signal P3 and the fourth control signal P4. When the turn-off circuit 114 receives the protection signal $S_{pro}$, the full-bridge circuit 118 is configured to generate a turn-off pulse signal based on the first output signal O1, the second output signal O2, the third output signal O3 and the fourth output signal O4.

In one embodiment, referring to FIG. 12A, the turn-off circuit 114 comprises an input terminal 114A, a first level-lowering unit and a second level-lowering unit. More specifically, the first level-lowering unit comprises a transistor Qa and a resistor Ra, the second level-lowering unit comprises a transistor Qd and a resistor Rd; the transistor Qa and transistor Qd respectively comprise a first terminal, a control terminal and a second terminal. Regarding the structural connection, the first terminal of the transistor Qa is coupled with the first input terminal IN1 of the first processing module IC1, the control terminal of the transistor Qa is coupled with the input terminal 114A of the turn-off circuit 114 via the resistor Ra, the second terminal is configured to be coupled with a ground terminal Gnd. On the other hand, the first terminal of the transistor Qd is coupled with the second input terminal IN2 of the second processing module IC2, the control terminal of the transistor Qd is coupled with the input terminal 114A of the turn-off circuit 114 via the resistor Rd, and the second terminal of the transistor Qd is configured to be coupled with the ground terminal Gnd.

In operation, when the first level-lowering unit receives the protection signal $S_{pro}$, the first level-lowering unit outputs a first driving-regulating signal VT1 to the first input terminal IN1 of the first processing module IC1. When the second level-lowering unit receives the protection signal $S_{pro}$, the second level-lowering unit outputs a fourth driving-regulating signal VT4 to the second input terminal IN2 of the second processing module IC2.

In another embodiment, referring to FIG. 12A, the turn-off circuit 114 comprises a first level-elevating unit and a second level-elevating unit. More specifically, the first level-elevating unit comprises a transistor Qb, and the second level-elevating unit comprises a transistor Qc; the transistor Qb and transistor Qc respectively comprise a first terminal, a control terminal and a second terminal. Regarding the structural connection, the first terminal of the transistor Qb is coupled with the second input terminal IN2 of the first processing module IC1, the control terminal of the transistor Qb is coupled with the input terminal 114A of the turn-off circuit 114, and the second terminal of the transistor Qb is configured to be coupled with the power supply Vcc2. On the other hand, the first terminal of the transistor Qc is coupled with the first input terminal IN1 of the second processing module IC2, the control terminal of the transistor Qc is coupled with the input terminal 114A of the turn-off circuit 114, and the second terminal of the transistor Qc is configured to be coupled with the power supply Vcc2.

In operation, when the first level-elevating unit receives the protection signal $S_{pro}$, the first level-elevating unit outputs a second driving-regulating signal VT2 to the second input terminal IN2 of the first processing module IC1. When the second level-elevating unit receives the protection signal $S_{pro}$, the second level-elevating unit outputs a third driving-regulating signal VT3 to the first input terminal IN1 of the second processing module IC2.

In still another embodiment, referring to FIG. 12A, the turn-off circuit 114 further comprises a first pulse-width modulator and a second pulse-width modulator. More specifically, the first pulse-width modulator comprises a capacitor Cb and a resistor Rb; the capacitor Cb and the resistor Rb respectively comprise a first terminal and a second terminal. The second pulse-width modulator comprises a capacitor Cc and a resistor Rc; the capacitor Cc and the resistor Rc respectively comprise a first terminal and a second terminal. Regarding the structural connection, the first terminal of the capacitor Cb is coupled with the input terminal 114A of the turn-off circuit 114, the first terminal of the resistor Rb is coupled with the second terminal of the capacitor Cb, and the second terminal of the resistor Rb is coupled with the control terminal of the transistor Qb. On the other hand, the first terminal of the capacitor Cc is coupled with the input terminal 114A of the turn-off circuit 114, the first terminal of the resistor Rc is coupled with the second terminal of the capacitor Cc, and the second terminal of the resistor Rc is coupled with the control terminal of the transistor Qc. In operation, the first pulse-width modulator and the second pulse-width modulator are configured to adjust the pulse-width of the turn-off pulse signal.

Figure 12B:
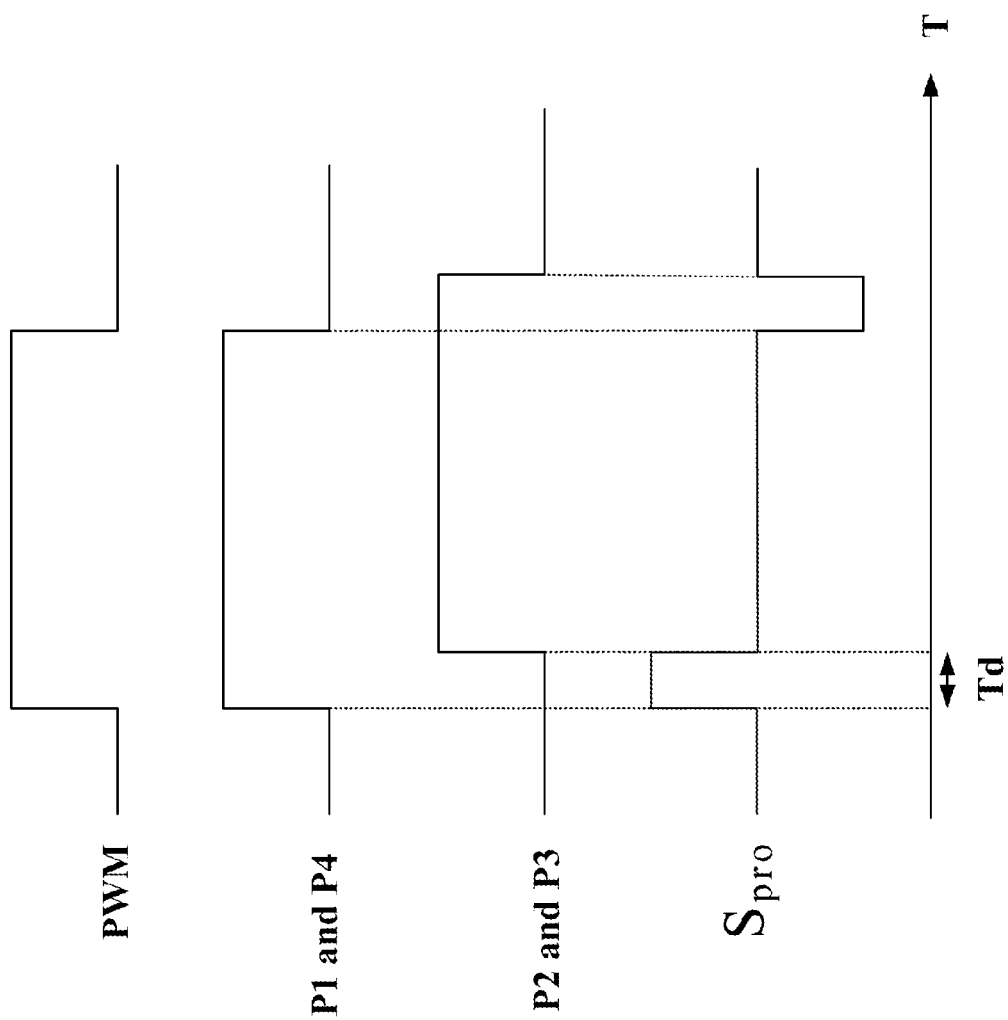
FIG. 12B is a schematic diagram of the waveform of a driving device according to yet another embodiment of the present disclosure.

FIG. 12B is a schematic diagram of the waveforms of a driving device according to embodiments of the present disclosure. In another embodiment, referring to both FIG. 12A and FIG. 12B, the driving device 100K further comprises a control circuit 150; the control circuit 150 is configured to generate a first control signal P1, a second control signal P2, a third control signal P3 and a fourth control signal P4. The first control signal P1 and the fourth control signal P4 have the same phase, said second control signal P2 and the third control signal P3 have the same phase, and the output time of the first control signal P1 and the fourth control signal P4 and the output time of the second control signal P2 and the third control signal P3 are spaced by a pre-determined delay time Td. When the control circuit 150 receives the protection signal $S_{pro}$, the control circuit 150 stops generating a first to fourth control signals P1~P4. However, the present disclosure is not limited to the circuit arrangements shown in FIG. 12A and FIG. 12B, which are only provided to exemplify one embodiment of the present disclosure.

Figure 13:
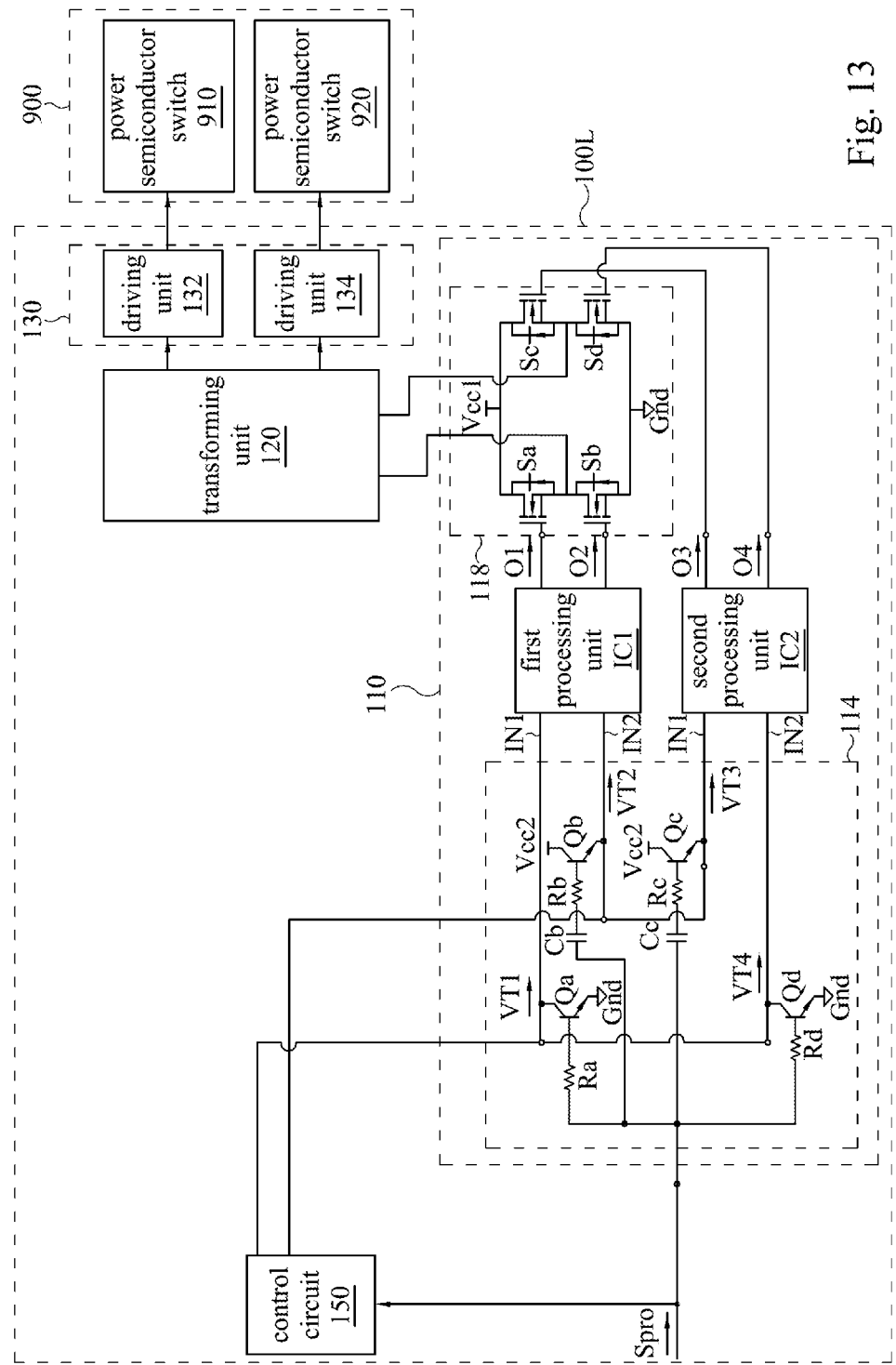
FIG. 13 is a schematic diagram of a driving device according to still another embodiment of the present disclosure.

FIG. 13 is a schematic diagram of a driving device 100L according to embodiments of the present disclosure. Compared with FIG. 12A, the control circuit 150 illustrated in FIG. 13 may provide a same main control signal to the first input terminal IN1 of the first processing module IC1 and the second input terminal IN2 of the second processing module IC2, and provide a same control signal to the second input terminal IN2 of the first processing module IC1 and the first input terminal IN1 of the second processing module IC2, wherein the time at which the first input terminal IN1 of the first processing module IC1 and the second input terminal IN2 of the second processing module IC2 receive the main control signal and the time at which the second input terminal IN2 of the first processing module IC1 and the first input terminal IN1 of the second processing module IC2 receives the main control signal are spaced by a pre-determined delay time. It should be noted that if the name of the electronic component in FIG. 13 is the same as that in FIG. 12A, it means that the two electronic components have the common electrical operation means, and hence, detailed description thereof is omitted herein for the sake of brevity.

Figure 14:
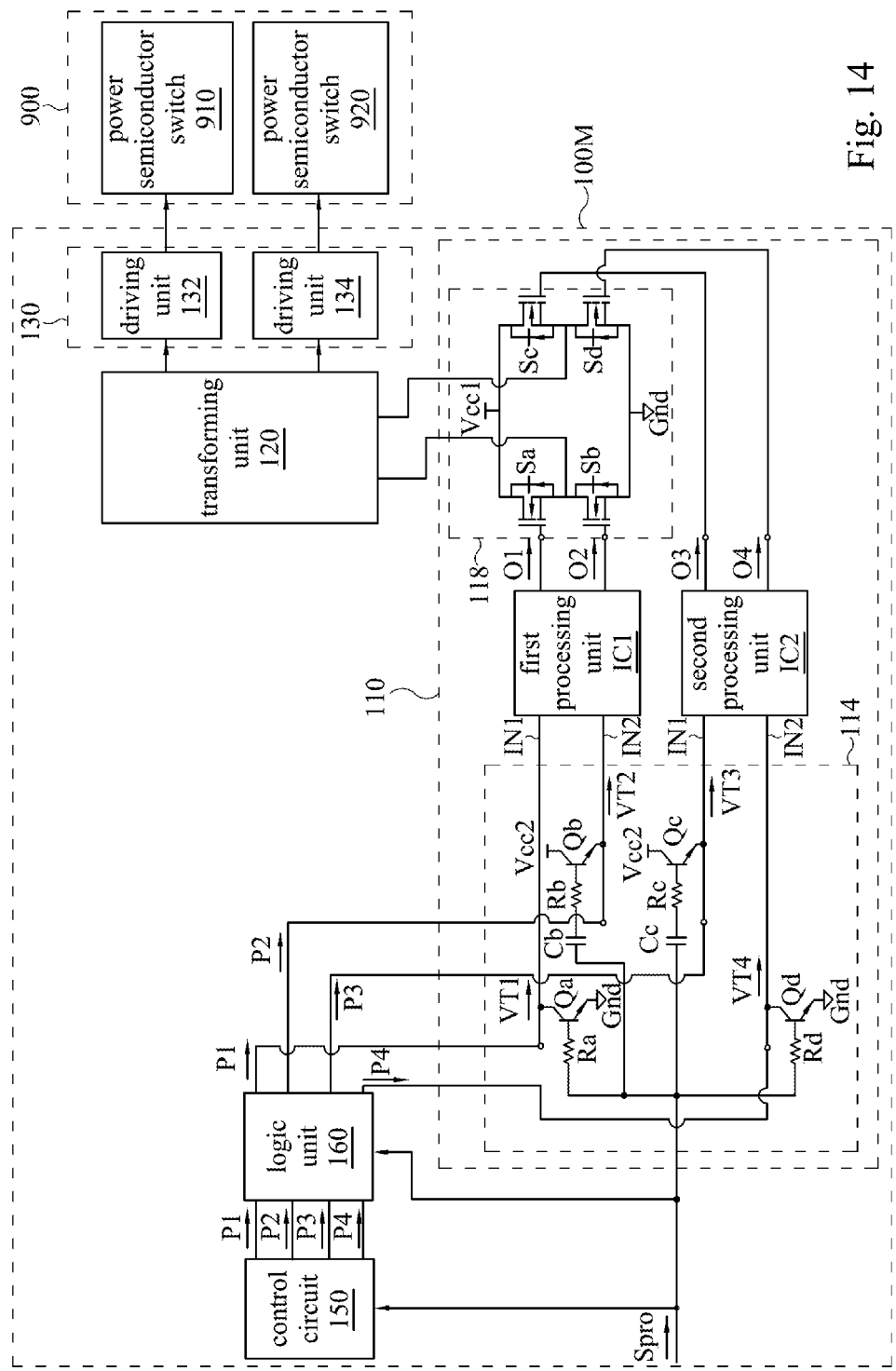
FIG. 14 is a schematic diagram of a driving device according to another embodiment of the present disclosure.

FIG. 14 is a schematic diagram of a driving device 100M according to embodiments of the present disclosure. Compared with the driving device 100K shown in FIG. 12A, the driving device 100M illustrated in FIG. 14 further comprises a logic unit 160. Said logic unit 160 is configured to receive a first control signal P1, a second control signal P2, a third control signal P3 and a fourth control signal P4 from the control circuit 150; then, the logic unit 160 respectively provides the first to fourth control signals P1~P4 to the first input terminal IN1 and the second input terminal IN2 of the first processing module IC1 and the first input terminal IN1 and the second input terminal IN2 of the second processing module IC2. When the logic unit 160 receives the protection signal $S_{pro}$, the logic unit 160 performs logic operation to the first to fourth control signals P1-P4 and the protection signal $S_{pro}$, so as to stop providing first to fourth control signals P1-P4. It should be noted that if the name of the electronic component in FIG. 14 is the same as that in FIG. 12A, it means that the two electronic components have the common electrical operation means, and hence, detailed description thereof is omitted herein for the sake of brevity.

Figure 15:
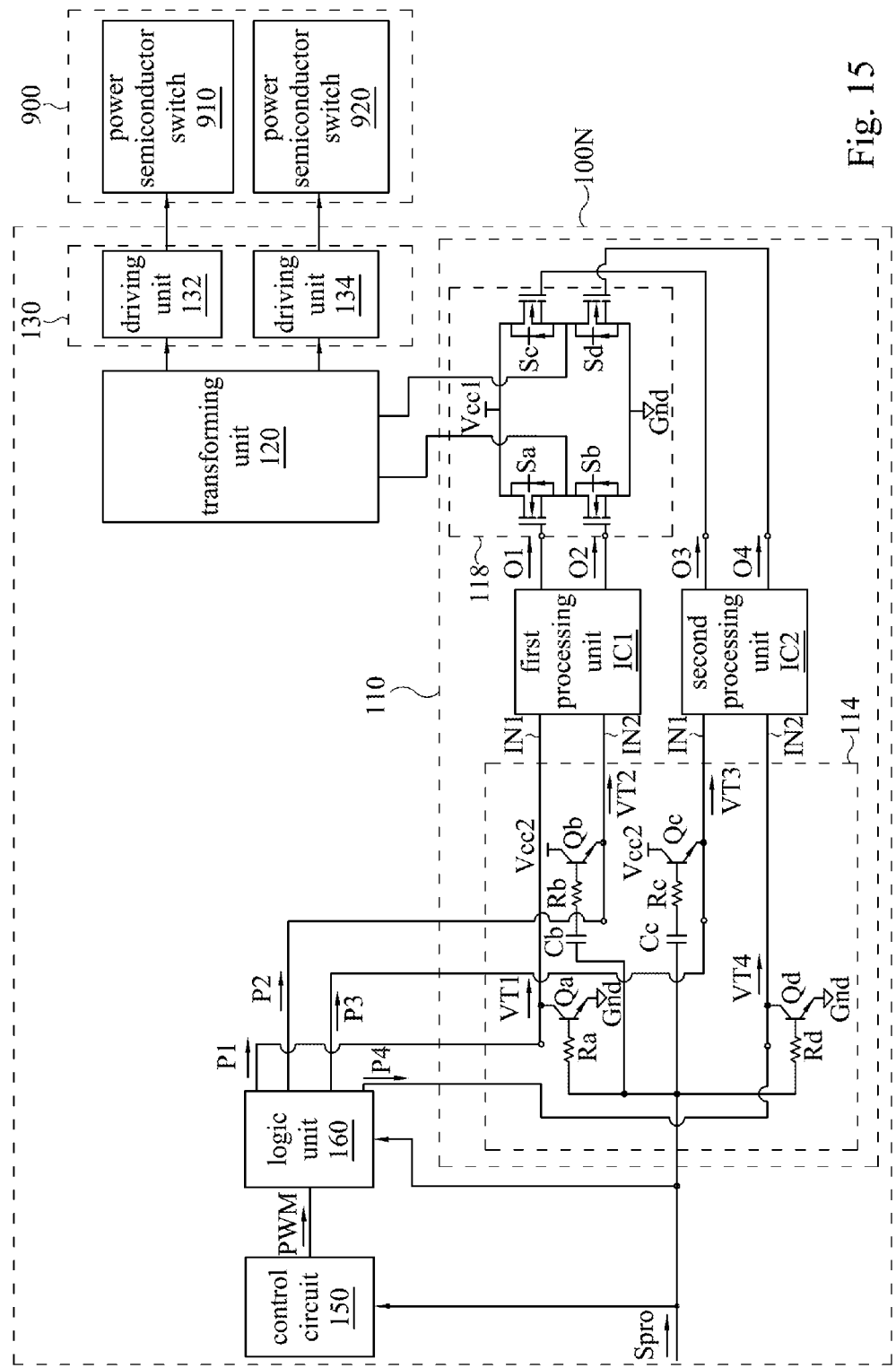
FIG. 15 is a schematic diagram of a driving device according to yet another embodiment of the present disclosure.

FIG. 15 is a schematic diagram of a driving device 100N according to embodiments of the present disclosure. Compared with the 100M illustrated in FIG. 14, the arrangement and operation of 100N shown in FIG. 15 are slightly different, as explained below. Referring to FIG. 15, the control circuit 150 is configured to output the main control signal PWM to the logic unit 160. Then, the logic unit 160 receives the main control signal PWM and respectively provides the first control signal P1, the second control signal P2, the third control signal P3 and the fourth control signal P4 to the first input terminal IN1 and the second input terminal IN2 of the first processing module IC1 and the first input terminal IN1 and the second input terminal IN2 of the second processing module IC2 based on the main control signal PWM. The first control signal P1 and the fourth control signal P4 have the same phase, the second control signal P2 and the third control signal P3 have the same phase, and the output time of the first control signal P1 and the fourth control signal P4 and the output time of the second control signal P2 and the third control signal P3 are spaced by a pre-determined delay time, said pre-determined time can be determined depending on actual needs. In one embodiment, when the control circuit 150 receives the protection signal $S_{pro}$, the control circuit 150 stops providing the main control signal PWM to the logic unit 160. It should be noted that if the name of the electronic component in FIG. 15 is the same as that in FIG. 12A, it means that the two electronic components have the common electrical operation means, and hence, detailed description thereof is omitted herein for the sake of brevity.

Figure 16:
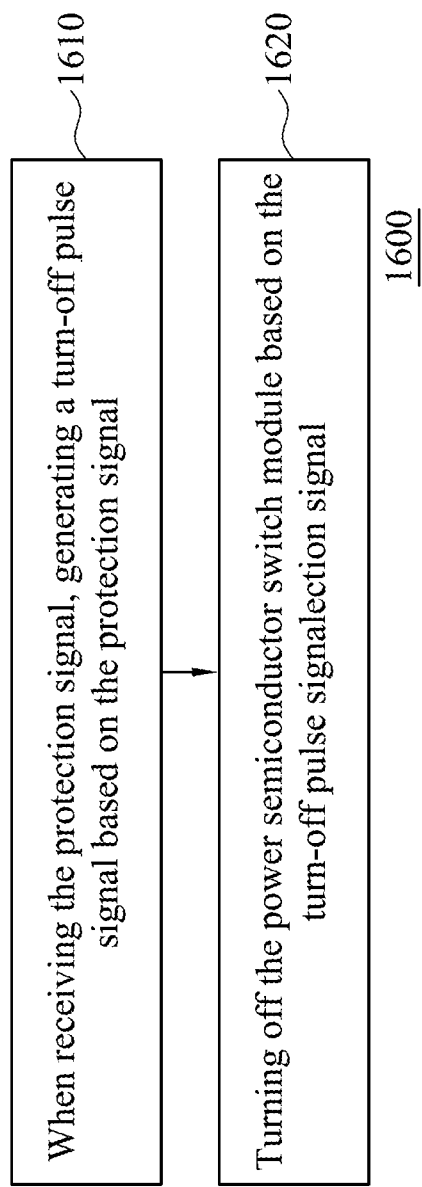
FIG. 16 is a flow diagram illustrating a driving method according to one embodiment of the present disclosure.

FIG. 16 is a flow diagram illustrating a driving method 1600 according to embodiments of the present disclosure. Generally, the driving method 1600 is used to drive the power semiconductor switch module based on the main control signal. As illustrated in FIG. 16, the driving method 1600 comprises the following steps:

Step 1610: when receiving the protection signal, generating a turn-off pulse signal based on the protection signal; and Step 1620: turning off the power semiconductor switch module based on the turn-off pulse signal.

To facilitate the understanding of the driving method 1600 according to the present disclosure, a reference is made to both FIG. 1A and FIG. 16. Referring to step 1610, when the protection signal $S_{pro}$ is received, the voltage-modulating unit 110 is used to generate a turn-off pulse signal based on the protection signal $S_{pro}$. Referring to step 1620, the driving module 130 is used to turn off the power semiconductor switch module based on the turn-off pulse signal. In this way, even though the driving signal is interrupted during the transmission process, the driving method 1600 according to the present disclosure can be used to generate a turn-off pulse signal when the protection signal $S_{pro}$ is received, so that it may effectively turn off the power semiconductor switch module based on the turn-off pulse signal.

In one embodiment, said step 1610 further comprises the steps of: generating a driving-regulating signal based on the protection signal; and generating a turn-off pulse signal based on the driving-regulating signal. To facilitate the understanding of the step 1610, a reference is made to both FIG. 3 and FIG. 16. In said step, the turn-off circuit 114 is used to generate a driving-regulating signal VT based on the protection signal $S_{pro}$, and then, the turn-off circuit 114 is used to generate a turn-off pulse signal based on the driving-regulating signal VT.

In another embodiment, the driving method 1600 further comprises the step of: when receiving the protection signal, performing logic operation to the main control signal and the protection signal so as to stop providing the main control signal. To facilitate the understanding of the present driving method 1600, a reference is made to both FIG. 4 and FIG. 16. In said step, when the logic unit 111 receives the protection signal $S_{pro}$, performing logic operation to the main control signal PWM and the protection signal $S_{pro}$ so as to stop providing the main control signal PWM.

In still another embodiment, the driving method 1600 further comprises the steps of: receiving the main control signal so as to output a first control signal; and performing delay operation to the first control signal so as to generate a second control signal. To facilitate the understanding of the present driving method 1600, a reference is made to both FIG. 5A and FIG. 16. In said step, the logic gate circuit 111A is used to receive the main control signal PWM so as to output the first control signal P1. Then, the delay circuit 111B is used to perform delay operation to the first output signal P1 so as to generate a second control signal P2.

In another embodiment, said step 1610 further comprises the steps of: generating a first driving-regulating signal and a second driving-regulating signal based on the protection signal; and generating a turn-off pulse signal based on the first driving-regulating signal and the second driving-regulating signal. To facilitate the understanding of the step 1610, a reference is made to both FIG. 5A and FIG. 16. In said step, the turn-off circuit 114 is used to generate a first driving-regulating signal VT1 and a second driving-regulating signal VT2 based on the protection signal $S_{pro}$. Then, the pulse-width modulating unit 113 is used to generate a turn-off pulse signal based on the first driving-regulating signal VT1 and the second driving-regulating signal VT2.

In yet another embodiment, the driving method 1600 further comprises the step of: adjusting the pulse-width of turn-off pulse signal. To facilitate the understanding of the present driving method 1600, a reference is made to both FIG. 5A and FIG. 16. In said step, the pulse-width modulator 114D is used to adjust the pulse-width of turn-off pulse signal.

In another embodiment, the driving method 1600 further comprises the steps of: providing the first control signal and the second control signal, wherein the output time of the first control signal and the output time of the second control signal are spaced by a pre-determined delay time. To facilitate the understanding of the present driving method 1600, a reference is made to both FIG. 6 and FIG. 16. In said step, the control circuit 150 is used to output the first control signal P1 and the second control signal P2. The output time of the first control signal P1 and the output time of the second control signal P2 are spaced by a pre-determined delay time, said pre-determined delay time may be determined depending on actual needs.

In yet another embodiment, the driving method 1600 further comprises the step of: when receiving the protection signal, performing logic operation to the first control signal, the second control signal, and the protection signal so as to stop outputting the first control signal and the second control signal. To facilitate the understanding of the present driving method 1600, a reference is made to both FIG. 7 and FIG. 16. In said step, when the logic unit 111 receives the protection signal $S_{pro}$, the logic unit 111 performs logic operation to the first and the second control signals P1, P2 and the protection signal $S_{pro}$ so as to stop outputting the first control signal P1 and the second control signal P2.

In still another embodiment, said step 1610 further comprises the steps of: providing the first control signal; and performing delay operation to the first control signal so as to generate a second control signal. To facilitate the understanding of the step 1610, a reference is made to both FIG. 8 and FIG. 16. In said step, the control circuit 150 is used to output the first control signal P1. Then, the delay circuit 115 is used to perform delay operation to the first control signal P1 so as to generate a second control signal P2.

In another embodiment, said step 1610 further comprises the steps of: receiving the protection signal, and generating a first driving-regulating signal, a second driving-regulating signal, a third driving-regulating signal, and a fourth driving-regulating signal based on the protection signal; receiving the first control signal and the first driving-regulating signal, and generating a first output signal based on the first control signal and the first driving-regulating signal; receiving the second control signal and the second driving-regulating signal, and generating a second output signal based on the second control signal and the second driving-regulating signal; receiving the third control signal and the third driving-regulating signal, and generating a third output signal based on the third control signal and the third driving-regulating signal; receiving the fourth control signal and the fourth driving-regulating signal, and generating a fourth output signal based on the fourth control signal and the fourth driving-regulating signal; and when receiving the protection signal, generating a turn-off pulse signal based on the first output signal, the second output signal, the third output signal and the fourth output signal. To facilitate the understanding of the step 1610, a reference is made to both FIG. 12A and FIG. 16. In said step, the turn-off circuit 114 is used to receive the protection signal $S_{pro}$, and generate a first driving-regulating signal VT1, a second driving-regulating signal VT2, a third driving-regulating signal VT3, and a fourth driving-regulating signal VT4 based on the protection signal $S_{pro}$.

Then, the first processing module IC1 is used to receive the first control signal P1 and the first driving-regulating signal VT1, and generate a first output signal O1 based on the first control signal P1 and the first driving-regulating signal VT1. The first processing module IC1 is used to receive the second control signal P2 and the second driving-regulating signal VT2, and generate a second output signal O2 based on the second control signal P2 and the second driving-regulating signal VT2. The second processing module IC2 is used to receive the third control signal P3 and the third driving-regulating signal VT3, and generate a third output signal O3 based on the third control signal P3 and the third driving-regulating signal VT3. The second processing module IC2 is used to receive the fourth control signal P4 and the fourth driving-regulating signal VT4, and generate a fourth output signal O4 based on the fourth control signal P4 and the fourth driving-regulating signal VT4. Next, when the turn-off circuit 114 receives the protection signal $S_{pro}$, the full-bridge circuit 118 is configured to generate a turn-off pulse signal based on the first output signal O1, the second output signal O2, the third output signal O3, and the fourth output signal O4.

In yet another embodiment, the driving method 1600 further comprises the step of: providing the first control signal, the second control signal, the third control signal, and the fourth control signal, wherein the first control signal and the fourth control signal have the same phase, the second control signal and the third control signal have the same phase, and the output time of the first control signal and the fourth control signal and the output time of the second control signal and the third control signal are spaced by a pre-determined delay time. To facilitate the understanding of the present driving method 1600, a reference is made to both FIG. 12A and FIG. 16. In said step, the control circuit 150 is used to generate a first control signal P1, a second control signal P2, a third control signal P3 and a fourth control signal P4. The first control signal P1 and the fourth control signal P4 have the same phase, the second control signal P2 and the third control signal P3 have the same phase, and the output time of the first control signal P1 and the fourth control signal P4 and the output time of the second control signal P2 and the third control signal P3 are spaced by a pre-determined delay time, said pre-determined delay time may be determined depending on actual needs.

The above-described driving method 1600 can be implemented by software, hardware and/or firmware. For example, if an implementer determines that speed and accuracy are paramount, the implementer may opt for a mainly hardware and/or firmware implementation; if flexibility is paramount, the implementer may opt for a mainly software implementation; alternatively, the collaboration of software, hardware and firmware may be adopted. It should be noted that none of the above-mentioned examples is inherently superior to the other and shall be considered limiting to the scope of the in present disclosure; rather, these examples can be utilized depending upon the context in which the unit/component will be deployed and the specific concerns of the implementer.

Further, as may be appreciated by persons having ordinary skill in the art, the steps of the driving method 1600 are named according to the function they perform, and such naming is provided to facilitate the understanding of the present disclosure but not to limit the steps. Combining the step into a single step or dividing any one of the steps into multiple steps, or switching any step so as to be a part of another step falls within the scope of the embodiments of the present disclosure.

In view of the above embodiments of the present disclosure, it is apparent that the application of the present disclosure has a number of advantages. The present embodiments provides a driving device and a driving method, in which the driving mechanism of the driving device can normally drive the power semiconductor switch module despite of the occurrence of the interruption; in this way, the present embodiments address the problems of failure to drive the power semiconductor switch module correctly caused by the driving signal being interrupted during the transmission process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driving device configured to drive a power semiconductor switch module based on a main control signal, the driving device comprising:
   a voltage-modulating unit, wherein when the voltage-modulating unit receives a protection signal, the voltage-modulating unit generates a turn-off pulse signal based on the protection signal, and wherein when the voltage-modulating unit does not receive the protection signal, the voltage-modulating unit modulates the main control signal into a positive-narrow pulse signal and a negative-narrow pulse signal, wherein the turn-off pulse signal is a negative pulse signal, and a pulse-width of the negative pulse signal is wider that a pulse-width of the negative-narrow pulse signal; and a driving module configured to turn off the power semiconductor switch module based on the turn-off pulse signal, wherein the voltage-modulating unit comprises:
  a signal processing unit configured to receive the main control signal; and
  a turn-off circuit configured to receive the protection signal and generate a driving-regulating signal based on the protection signal, so that the signal processing unit generates the turn-off pulse signal based on the driving-regulating signal.

2. The driving device of claim 1, further comprising:
a transforming unit coupled between the voltage-modulating unit and the driving module, and configured to transfer the turn-off pulse signal from the voltage-modulating unit to the driving module.

3. The driving device of claim 1, further comprising:
a control circuit configured to provide the main control signal to the signal processing unit, wherein when the control circuit receives the protection signal, the control circuit stops providing the main control signal to the signal processing unit.

4. The driving device of claim 1, wherein the signal processing unit further comprises:
a pulse-width modulating unit coupled with the turn-off circuit, and configured to receive the driving-regulating signal and generate the turn-off pulse signal based on the driving-regulating signal.

5. The driving device of claim 4, wherein the signal processing unit further comprises:
a logic unit coupled with the pulse-width modulating unit, and configured to receive and provide the main control signal to the pulse-width modulating unit, wherein when the logic circuit receives the protection signal, the logic unit performs logical operation to the main control signal and the protection signal so as to stop providing the main control signal to the pulse-width modulating unit.

6. The driving device of claim 5, further comprising:
a control circuit configured to provide the main control signal to the logic unit, wherein when the control circuit receives the protection signal, the control circuit stops providing the main control signal to the logic unit.

7. The driving device of claim 1, wherein the voltage-modulating unit comprises:
a logic unit configured to receive the main control signal and output a first control signal and a second control signal, wherein the output time of the first control signal and the output time of the second control signal are spaced by a pre-determined delay time, wherein when the logic unit receives the protection signal, the logic unit performs logical operation to the main control signal and the protection signal so as to stop outputting the first control signal and the second control signal.

8. The driving device of claim 7, wherein the logic unit comprises:
a logic gate circuit configured to receive the main control signal and output the first control signal; and
a delay circuit configured to receive the first control signal and performs a delay operation to the first control signal to generate the second control signal.

9. The driving device of claim 1, further comprising:
a control circuit configured to output a first control signal and a second control signal, wherein the main control signal comprises the first control signal and the second control signal, wherein the output time of the first control signal and the output time of the second control signal are spaced by a pre-determined delay time.

10. The driving device of claim 9, wherein the voltage-modulating unit comprises:
a logic unit configured to receive and provide the first control signal and the second control signal, wherein when the logic unit receives the protection signal, the logic unit performs logic operation to the first and the second control signal and the protection signal so as to stop outputting the first control signal and the second control signal.

11. The driving device of claim 7, wherein the voltage-modulating unit comprises:
a turn-off circuit configured to receive the protection signal and generate a first driving-regulating signal and a second driving-regulating signal based on the protection signal; and
a pulse-width modulating unit, comprising:
  a first input terminal configured to receive the first control signal and the first driving-regulating signal; and
  a second input terminal configured to receive the second control signal and the second driving-regulating signal, wherein when the turn-off circuit receives the protection signal, the pulse-width modulating unit generates the turn-off pulse signal based on the first driving-regulating signal and the second driving-regulating signal.

12. The driving device of claim 11, wherein the turn-off circuit comprises:
an input terminal configured to receive the protection signal;
a level-lowering unit coupled between the input terminal and the first input terminal of the pulse-width modulating unit, wherein when the level-lowering unit receives the protection signal, the level-lowering unit outputs the first driving-regulating signal to the first input terminal of the pulse-width modulating unit; and
a level-elevating unit coupled between the input terminal and the second input terminal of the pulse-width modulating unit, wherein when the level-elevating unit receives the protection signal, the level-elevating unit outputs the second driving-regulating signal to the second input terminal of the pulse-width modulating unit.

13. The driving device of claim 12, wherein the level-lowering unit comprises:
a transistor, comprising:
  a first terminal coupled with the first input terminal of the pulse-width modulating unit;
  a control terminal coupled with the input terminal of the turn-off circuit; and
  a second terminal configured to be coupled with a ground terminal.

14. The driving device of claim 12, wherein the level-elevating unit comprises:
a transistor, comprising:
a first terminal coupled with the second input terminal of the pulse-width modulating unit;
a control terminal coupled with the input terminal of the turn-off circuit; and
a second terminal configured to receive a power supply.

15. The driving device of claim 14, wherein the turn-off circuit further comprises:
a pulse-width modulator coupled between the input terminal of the turn-off circuit and the control terminal of the transistor, and configured to adjust the pulse-width of the turn-off pulse signal.

16. The driving device of claim 15, wherein the pulse-width modulator comprises:
a capacitor comprising a first terminal and a second terminal, wherein the first terminal of the capacitor is coupled with the input terminal of the turn-off circuit; and
a resistor comprising a first terminal and a second terminal, wherein the first terminal of the resistor is coupled with the second terminal of the capacitor, and the second terminal of the resistor is coupled with the control terminal of the transistor.

17. The driving device of claim 1, further comprising:
a control circuit configured to output a first control signal, wherein the voltage-modulating unit comprises:
a delay circuit configured to receive the first control signal and perform a delay operation to the first control signal so as to generate a second control signal, wherein the main control signal comprises the first control signal and the second control signal.

18. The driving device of claim 17, wherein the voltage-modulating unit comprises:
a turn-off circuit configured to receive the protection signal and generate a first driving-regulating signal and a second driving-regulating signal based on the protection signal; and
a pulse-width modulating unit, comprising:
a first processing unit, comprising:
an input terminal configured to receive the first control signal; and
an enabling terminal configured to receive the first driving-regulating signal; and
a second processing unit, comprising:
an input terminal configured to receive the second control signal and the second driving-regulating signal; and
an enabling terminal configured to receive a voltage,
wherein when the turn-off circuit receives the protection signal, the enabling terminal of the first processing unit puts the first processing unit in a disabled operation mode based on the first driving-regulating signal, and between an output terminal of the first processing unit and an output terminal of the second processing unit generates the turn-off pulse signal based on the first driving-regulating signal and the second driving-regulating signal.

19. The driving device of claim 18, wherein the turn-off circuit comprises:
a phase inverter configured to perform a phase-inversion operation to the protection signal so as to generate the first driving-regulating signal to the enabling terminal of the first processing unit.

20. The driving device of claim 19, wherein the turn-off circuit comprises:
an input terminal configured to receive the protection signal; and
a level-elevating unit coupled between the input terminal and the input terminal of the second processing unit, wherein when the level-elevating unit receives the protection signal, the level-elevating unit outputs the second driving-regulating signal.

21. The driving device of claim 20, wherein the level-elevating unit comprises:
a transistor, comprising:
a first terminal coupled with the input terminal of the second processing unit;
a control terminal coupled with the input terminal of the turn-off circuit; and
a second terminal configured to receive a power supply.

22. The driving device of claim 21, wherein the turn-off circuit further comprises
a pulse-width modulator coupled between the input terminal of the turn-off circuit and the control terminal of the transistor, and configured to adjust the pulse-width of the turn-off pulse signal.

23. The driving device of claim 22, wherein the pulse-width modulator comprises:
a capacitor comprising a first terminal and a second terminal, wherein the first terminal of the capacitor is coupled with the input terminal of the turn-off circuit; and
a resistor comprising a first terminal and a second terminal, wherein the first terminal of the resistor is coupled with the second terminal of the capacitor, and the second terminal of the resistor is coupled the control terminal of the transistor.

24. The driving device of claim 18, wherein the turn-off circuit comprises:
an input terminal configured to receive the protection signal; and
a level-lowering unit coupled between the input terminal and the first processing unit, and configured to receive a voltage, wherein when the level-lowering unit receives the protection signal, the level-lowering unit is configured to generate the first driving-regulating signal so as to disable the first processing unit.

25. The driving device of claim 24, wherein the level-lowering unit comprises:
a transistor comprising:
a first terminal configured to be coupled with the enabling terminal of the first processing unit, and receive the voltage;
a control terminal coupled with the input terminal; and
a second terminal configured to be coupled with a ground terminal.

26. The driving device of claim 1, wherein the voltage-modulating unit comprises:
a turn-off circuit configured to receive the protection signal and generate a first driving-regulating signal, a second driving-regulating signal, a third driving-regulating signal and a fourth driving-regulating signal, based on the protection signal;
a first processing module coupled with the turn-off circuit, and comprising:
a first input terminal configured to receive a first control signal and the first driving-regulating signal, and generate a first output signal based on the first control signal and the first driving-regulating signal; and
a second input terminal configured to receive second control signal and the second driving-regulating signal, and generate a second output signal based on the second control signal and the second driving-regulating signal, wherein the main control signal comprises the first control signal and the second control signal;
a second processing module coupled with the turn-off circuit, and comprising:
a first input terminal configured to receive a third control signal and the third driving-regulating signal, and generate a third output signal based on the third control signal and the third driving-regulating signal; and a second input terminal configured to receive a fourth control signal and the fourth driving-regulating signal, and generate a fourth output signal based on the fourth control signal and the fourth driving-regulating signal, wherein the main control signal comprises the third control signal and the fourth control signal; and a full-bridge circuit, coupled between the first processing module and the second processing module, wherein when the turn-off circuit receives the protection signal, the full-bridge circuit is configured to generate the turn-off pulse signal based on the first output signal, the second output signal, the third output signal and the fourth output signal.

27. The driving device of claim 26, wherein the turn-off circuit comprises:
an input terminal configured to receive the protection signal;
a first level-lowering unit coupled between the input terminal and the first input terminal of the first processing module, wherein when the first level-lowering unit receives the protection signal, the first level-lowering unit outputs the first driving-regulating signal to the first input terminal of the first processing module; and
a second level-lowering unit coupled between the input terminal and the second input terminal of the second processing module, wherein when the second level-lowering unit receives the protection signal, the second level-lowering unit outputs the fourth driving-regulating signal to the second input terminal of the second processing module.

28. The driving device of claim 27, wherein the first level-lowering unit comprises:
a first transistor, comprising:
a first terminal coupled with the first input terminal of the first processing module;
a control terminal coupled with the input terminal of the turn-off circuit; and
a second terminal configured to be coupled with a ground terminal; and
a first resistor coupled with the control terminal of the first transistor;
wherein the second level-lowering unit, comprises:
a second transistor, comprising:
a first terminal coupled with the second input terminal of the second processing module;
a control terminal coupled with the input terminal of the turn-off circuit; and
a second terminal configured to be coupled with the ground terminal; and
a second resistor coupled with the control terminal of the second transistor.

29. The driving device of claim 27, wherein the turn-off circuit comprises:
a first level-elevating unit coupled between the input terminal and the second input terminal of the first processing module, wherein when the first level-elevating unit receives the protection signal, the first level-elevating unit outputs the second driving-regulating signal to the second input terminal of the first processing module; and
a second level-elevating unit coupled between the input terminal and the first input terminal of the second processing module, wherein when the second level-elevating unit receives the protection signal, the second level-elevating unit outputs the third driving-regulating signal to the first input terminal of the second processing module.

30. The driving device of claim 29, wherein the first level-elevating unit comprises:
a first transistor, comprising:
a first terminal coupled with a second input terminal of the first processing module;
a control terminal coupled with the input terminal of the turn-off circuit; and
a second terminal configured to be coupled with a power supply ;
wherein the second level-elevating unit comprises:
a second transistor, comprising:
a first terminal coupled with a first input terminal of the second processing module;
a control terminal coupled with the input terminal of the turn-off circuit; and
a second terminal configured to be coupled with the power supply.

31. The driving device of claim 30, wherein the turn-off circuit further comprises:
a first pulse-width modulator coupled between the input terminal of the turn-off circuit and the control terminal of the first transistor, and configured to adjust the pulse-width of the turn-off pulse signal; and
a second pulse-width modulator coupled between the input terminal of the turn-off circuit and the control terminal of the second transistor, and configured to adjust the pulse-width of the turn-off pulse signal.

32. The driving device of claim 31, wherein the first pulse-width modulator comprises:
a first capacitor comprising a first terminal and a second terminal, wherein the first terminal of the first capacitor is coupled with the input terminal of the turn-off circuit; and
a first resistor comprising a first terminal and a second terminal, wherein the first terminal of the first resistor is coupled with the second terminal of the first capacitor, and the second terminal of the first resistor is coupled with the control terminal of the first transistor,
wherein the second pulse-width modulator comprises:
a second capacitor comprising a first terminal and a second terminal, wherein the first terminal of the second capacitor is coupled with the input terminal of the turn-off circuit; and
a second resistor comprising a first terminal and a second terminal, wherein the first terminal of the second resistor is coupled with the second terminal of the second capacitor, and the second terminal of the second resistor is coupled with the control terminal of the second transistor.

33. The driving device of claim 26, further comprising:
a control circuit configured to generate the first control signal, the second control signal, the third control signal and the fourth control signal, wherein the first control signal and the fourth control signal have the same phase, the second control signal and the third control signal have the same phase, and the output time of the first control signal and the fourth control signal and the output time of the second control signal and the third control signal are spaced by a pre-determined delay time,
wherein when the control circuit receives the protection signal, the control circuit stops generating the first to fourth control signals.

34. The driving device of claim 33, further comprising:
a logic unit configured to receive and respectively provide the first control signal, the second control signal, the third control signal and the fourth control signal to the first input terminal and the second input terminal of the first processing module and the first input terminal and the second input terminal of the second processing module, wherein when the logic unit receives the protection signal, the logic unit performs logic operation to the first control signal to the fourth control signal and the protection signal, so as to stop providing the first control signal to the fourth control signal.

35. The driving device of claim 26, further comprising:
a logic unit configured to receive the main control signal and respectively provide the first control signal, the second control signal, the third control signal and the fourth control signal to the first input terminal and the second input terminal of the first processing module and the first input terminal and the second input terminal of the second processing module based on the main control signal, wherein the first control signal and the fourth control signal have the same phase, the second control signal and the third control signal have the same phase, and the output time of the first control signal and the fourth control signal and the output time of the second control signal and the third control signal are spaced by a pre-determined delay time,
wherein when the logic unit receives the protection signal, the logic unit performs logic operation to the first control signal to the fourth control signals and the protection signal, so as to stop providing the first control signal to the fourth control signal.

36. The driving device of claim 35, further comprising:
a control circuit configured to output the main control signal to the logic unit, wherein when the control circuit receives the protection signal, the control circuit stops providing the main control signal to the logic unit.

37. The driving device of claim 1, wherein the power semiconductor switch module comprises:
at least one power semiconductor switch module; and
wherein the driving module comprises:
at least one driving unit, the driving unit being configured to receive the turn-off pulse signal, and turn off the corresponding power semiconductor switch module based on the turn-off pulse signal.

38. A driving method for driving a power semiconductor switch module based on a main control signal, comprising:
receiving the main control signal and modulating the main control signal into a positive-narrow pulse signal and a negative-narrow pulse signal;
generating a turn-off pulse signal based on a protection signal when receiving the protection signal; and
turning off the power semiconductor switch module based on the turn-off pulse signal, wherein the turn-off pulse signal is a negative pulse signal, and a pulse-width of the negative pulse signal is wider than a pulse-width of the negative-narrow pulse signal.

39. The driving method of claim 38, wherein the step of generating the turn-off pulse signal based on the protection signal when receiving the protection signal comprises:
generating a driving-regulating signal based on the protection signal; and
generating the turn-off pulse signal based on the driving-regulating signal.

40. The driving method of claim 38, further comprising:
performing logical operation to the main control signal and the protection signal when receiving the protection signal, so as to stop providing the main control signal.

41. The driving method of claim 38, further comprising:
receiving the main control signal to output a first control signal; and
performing delay operation to the first control signal to generate a second control signal.

42. The driving method of claim 38, further comprising:
providing a first control signal and a second control signal, wherein the output time of the first control signal and the output time of the second control signal are spaced by a pre-determined delay time, wherein the main control signal comprises the first control signal and the second control signal.

43. The driving method of claim 42, further comprising:
performing logic operation to the first control signal and the second control signal and the protection signal when receiving the protection signal, so as to stop outputting the first control signal and the second control signal.

44. The driving method of claim 38, wherein the step of generating the turn-off pulse signal based on the protection signal when receiving the protection signal comprises:
generating a first driving-regulating signal and a second driving-regulating signal based on the protection signal; and
generating the turn-off pulse signal based on the first driving-regulating signal and the second driving-regulating signal.

45. The driving method of claim 38, further comprising:
adjusting the pulse-width of the turn-off pulse signal.

46. The driving method of claim 38, further comprising:
providing a first control signal; and
performing delay operation to the first control signal so as to generate a second control signal, wherein the main control signal comprises the first control signal and the second control signal.

47. The driving method of claim 38, wherein the step of generating the turn-off pulse signal based on the protection signal when receiving a protection signal comprises:
receiving the protection signal and generating a first driving-regulating signal, a second driving-regulating signal, a third driving-regulating signal and a fourth driving-regulating signal based on the protection signal;
receiving a first control signal and the first driving-regulating signal and generating a first output signal based on the first control signal and the first driving-regulating signal, receiving a second control signal and the second driving-regulating signal and generating a second output signal based on the second control signal and the second driving-regulating signal, wherein the main control signal comprises the first control signal and the second control signal, receiving a third control signal and the third driving-regulating signal and generating a third output signal based on the third control signal and the third driving-regulating signal, and receiving a fourth control signal and the fourth driving-regulating signal and generating a fourth output signal based on the fourth control signal and the fourth driving-regulating signal, wherein the main control signal comprises the third control signal and the fourth control signal; and generating the turn-off pulse signal based on the first output signal, the second output signal, the third output signal and the fourth output signal, when receiving the protection signal.

48. The driving method of claim 47, further comprising: providing the first control signal, the second control signal, the third control signal and the fourth control signal, wherein the first control signal and the fourth control signal have the same phase, the second control signal and the third control signal have the same phase, and the output time of the first control signal and the fourth control signal and the output time of the second control signal and the third control signal are spaced by a pre-determined delay time.

* * * * *